United States Patent
Yamazaki et al.

(10) Patent No.: US 9,166,192 B2
(45) Date of Patent: Oct. 20, 2015

(54) DISPLAY DEVICE HAVING PLURAL SEALANTS AT PERIPHERY OF PIXEL PORTION

(71) Applicant: SEMICONDUCTOR ENERGY LABORATORY CO., LTD., Atsugi-shi, Kanagawa-ken (JP)

(72) Inventors: Shunpei Yamazaki, Tokyo (JP); Yoshiharu Hirakata, Kanagawa (JP); Takeshi Nishi, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 126 days.

(21) Appl. No.: 13/974,841

(22) Filed: Aug. 23, 2013

(65) Prior Publication Data

US 2014/0061612 A1 Mar. 6, 2014

(30) Foreign Application Priority Data

Aug. 28, 2012 (JP) ................................ 2012-188066

(51) Int. Cl.
*H01L 33/56* (2010.01)
*H01L 51/52* (2006.01)
*G09G 3/32* (2006.01)

(52) U.S. Cl.
CPC ............ *H01L 51/5246* (2013.01); *H01L 33/56* (2013.01); *H01L 51/5243* (2013.01); *G09G 3/3208* (2013.01)

(58) Field of Classification Search
CPC .................................................. H01L 51/5243
See application file for complete search history.

(56) References Cited

U.S. PATENT DOCUMENTS

| | | |
|---|---|---|
| 4,357,557 A | 11/1982 | Inohara et al. |
| 4,640,583 A | 2/1987 | Hoshikawa et al. |
| 5,731,856 A | 3/1998 | Kim et al. |
| 5,744,864 A | 4/1998 | Cillessen et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Coates,D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

(Continued)

*Primary Examiner* — Stephen W Smoot
(74) *Attorney, Agent, or Firm* — Nixon Peabody LLP; Jeffrey L. Costellia

(57) ABSTRACT

A highly reliable display device is provided. Alternatively, a display device with a narrow frame is provided. The display device includes: a first substrate and a second substrate facing each other; a pixel portion including a display element, between the first substrate and the second substrate; a first sealant provided around a periphery of the pixel portion; a second sealant which is in contact with at least one of a side surface of the first substrate and a side surface of the second substrate and with which a gap between the first substrate and the second substrate is filled; and a third sealant overlapping with a side surface of the first sealant and at least one of the side surface of the first substrate and the side surface of the second substrate with the second sealant interposed therebetween.

20 Claims, 9 Drawing Sheets

(56) References Cited

U.S. PATENT DOCUMENTS

| | | |
|---|---|---|
| 6,219,127 B1 | 4/2001 | Hirakata et al. |
| 6,294,274 B1 | 9/2001 | Kawazoe et al. |
| 6,563,174 B2 | 5/2003 | Kawasaki et al. |
| 6,580,094 B1 | 6/2003 | Yamazaki et al. |
| 6,605,826 B2 | 8/2003 | Yamazaki et al. |
| 6,727,522 B1 | 4/2004 | Kawasaki et al. |
| 6,864,943 B2 | 3/2005 | Hirakata et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,199,855 B2 | 4/2007 | Yoshimi et al. |
| 7,211,825 B2 | 5/2007 | Shih et al |
| 7,230,669 B1 | 6/2007 | Tashiro et al. |
| 7,282,782 B2 | 10/2007 | Hoffman et al. |
| 7,283,185 B2 | 10/2007 | Hirakata et al. |
| 7,297,977 B2 | 11/2007 | Hoffman et al. |
| 7,323,356 B2 | 1/2008 | Hosono et al. |
| 7,369,212 B2 | 5/2008 | Tashiro et al. |
| 7,372,535 B2 | 5/2008 | Tashiro et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,579,203 B2 | 8/2009 | Yamazaki et al. |
| 7,674,650 B2 | 3/2010 | Akimoto et al. |
| 7,732,819 B2 | 6/2010 | Akimoto et al. |
| 7,733,457 B2 | 6/2010 | Tashiro et al. |
| 7,738,073 B2 | 6/2010 | Inoue et al. |
| 7,897,003 B2 | 3/2011 | Tashiro |
| 8,289,481 B2 | 10/2012 | Tashiro et al. |
| 8,648,345 B2 | 2/2014 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0170839 A1 | 7/2007 | Choi et al. |
| 2007/0170860 A1 | 7/2007 | Choi et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0123042 A1 | 5/2008 | Tashiro et al. |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0004772 A1 | 1/2009 | Jinbo et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0302760 A1* | 12/2009 | Tchakarov et al. ........... 313/512 |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0134746 A1 | 6/2010 | Tashiro et al. |
| 2011/0012112 A1 | 1/2011 | Yamazaki et al. |
| 2012/0061718 A1 | 3/2012 | Yamazaki et al. |
| 2012/0126234 A1 | 5/2012 | Yamazaki et al. |
| 2012/0161603 A1 | 6/2012 | Van Montfort et al. |
| 2012/0241802 A1 | 9/2012 | Philippens et al. |
| 2012/0300151 A1 | 11/2012 | Yamazaki et al. |
| 2013/0001582 A1 | 1/2013 | Kadono et al. |
| 2013/0048967 A1 | 2/2013 | Nishido et al. |
| 2014/0063432 A1 | 3/2014 | Yamazaki et al. |
| 2014/0065430 A1 | 3/2014 | Yamazaki et al. |

FOREIGN PATENT DOCUMENTS

| | | |
|---|---|---|
| JP | 60-198861 A | 10/1985 |
| JP | 62-091623 A | 6/1987 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-005890 A | 1/1993 |
| JP | 05-251705 A | 9/1993 |
| JP | 08-264794 A | 10/1996 |
| JP | 10-172757 | 6/1998 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-123861 | 5/2007 |
| JP | 2007-165861 | 6/2007 |

(56) References Cited

FOREIGN PATENT DOCUMENTS

| JP | 2011-018479 | 1/2011 |
|---|---|---|
| JP | 2011-044699 | 3/2011 |
| WO | WO-2004/114391 | 12/2004 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka. N. et al., "Spinel,YBFE2O4, and YB2FE3O7 Types of Structures for Compounds in the IN2O3 and SC2O3—A2O3—BO Systems [A; Fe, Ga, or Al; B: Mg, Mn, Fe, Ni, Cu,or Zn] At Temperatures Over 1000° C.", Journal of Solid State Chemistry, 1985, vol. 60, pp. 382-384.

Nakamura,M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04: SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDS", Journal of the SID, 2007, vol. 15, No, 1, pp. 17-22.

Park. S et al., "Challenge to Future Displays: Transparent AM-OLED Driven by Peald Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "Suftla Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Lee. J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Park. J et al., "Amorphous Indium—Gallium—Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-in. AMOLED Display With Driver Circuit Using Amorphous In—Ga—Zn—Oxide TFTs", IDW '09 : Proceedings of the 16th International Display Workshops, 2009, pp. 689-692.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2; Intermediate Connector With Suppressed Voltage Loss for White Tandem OLEDS", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Lee.M et al., "15.4:Excellent Performance of Indium—Oxide—Based Thin-Film Transistors by DC Sputtering", SID Digest '09 : SID International Symposium Digest of Technical Papers, May 31, 2009, pp. 191-193.

Cho.D et al., "21.2:Al and SN-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Ohara.H et al., "21.3:4.0 in. QVGA AMOLED Display Using In—Ga—Zn—Oxide TFTs With a Novel Passivation Layer", SID Digest '09 SID International Symposium Digest of Technical Papers, May 31, 2009, pp. 284-287.

Godo.H at al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Osada.T et al, "Development of Driver-Integrated Panel Using Amorphous In—Ga—Zn—Oxide TFT", AM-FPD '09 Digest of Technical Papers, Jul. 1, 2009, pp. 33-36.

Godo.H et al., "Temperature Dependence of Characteristics and Electronic Structure For Amorphous In—Ga—Zn—Oxide TFT", AM-FPD '09 Digest of Technical Papers, Jul. 1, 2009, pp. 41-44.

(56) References Cited

OTHER PUBLICATIONS

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4);a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters), 2005, vol. 87, pp. 122102-1-122102-3.

Clark.S et al., "First Principles Methods Using Castep", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, 2008, vol. 39, pp. 1277-1280.

Oba.F at al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance amorphous oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of The 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato. E et al., "Wide-Bandgap High-Mobility ZnO Thin-Film Transistors Produced At Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

\* cited by examiner

FIG. 4A1
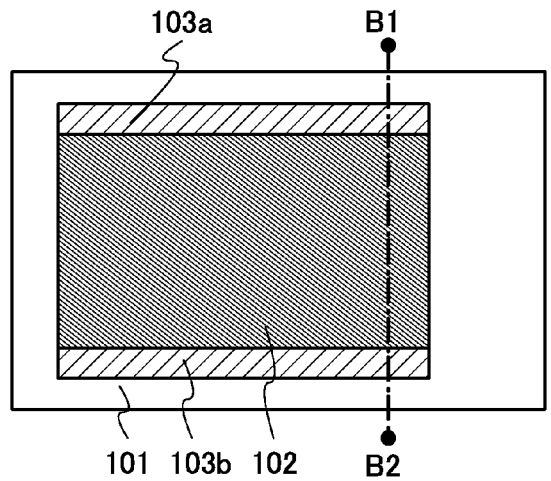
FIG. 4A2
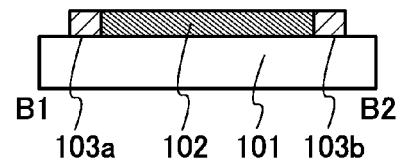
FIG. 4B1
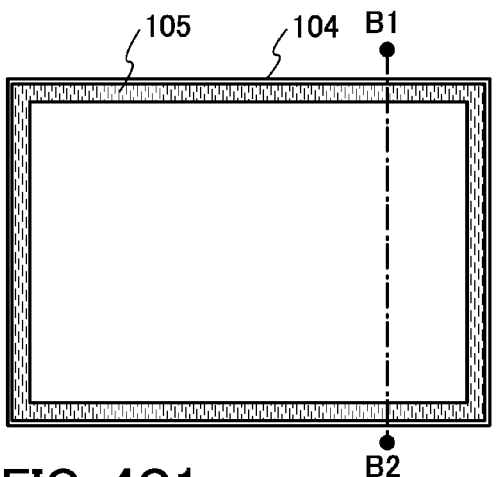
FIG. 4B2
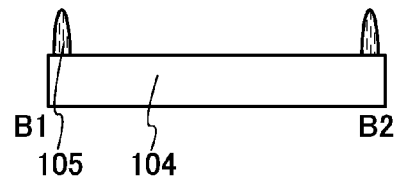
FIG. 4C1
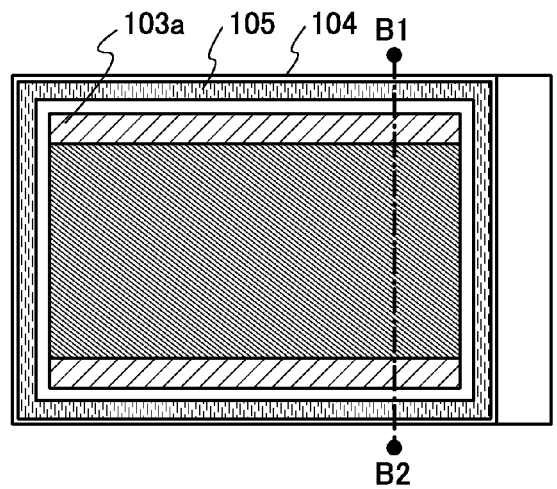
FIG. 4C2
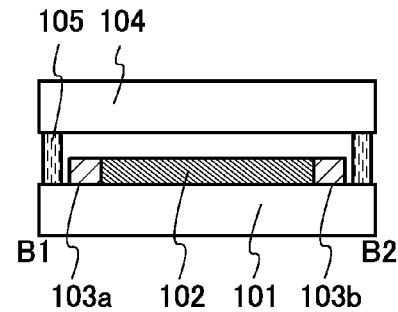

FIG. 5A1
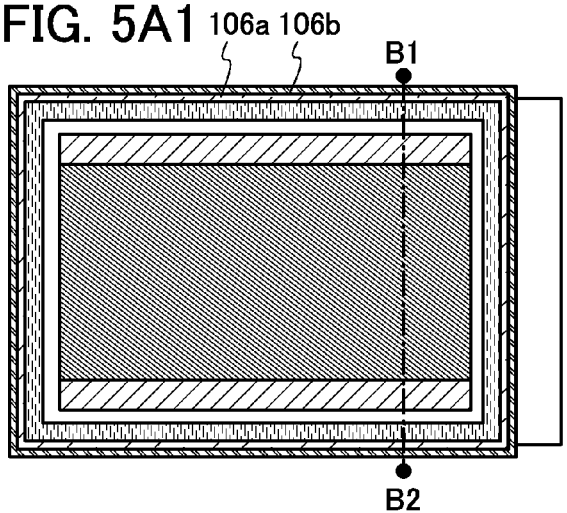
FIG. 5A2
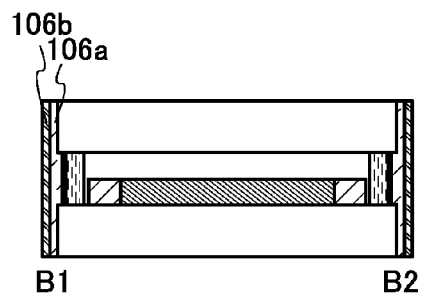
FIG. 5B1
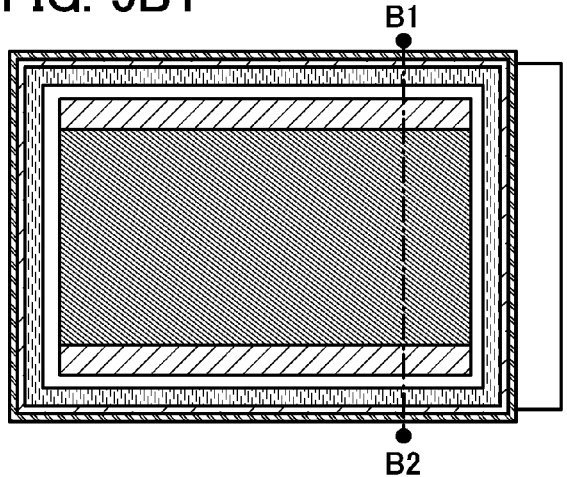
FIG. 5B2
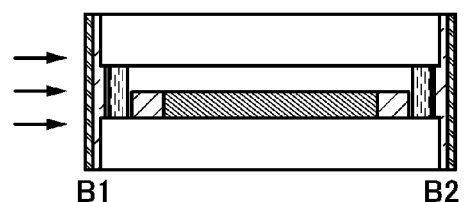
FIG. 5C1
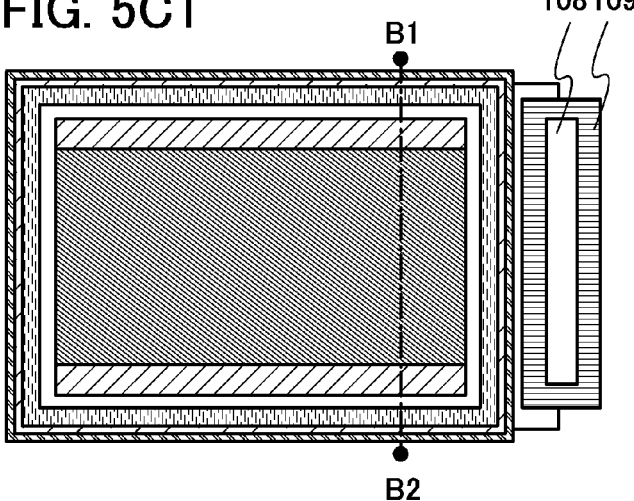
FIG. 5C2
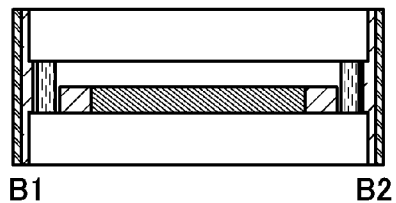

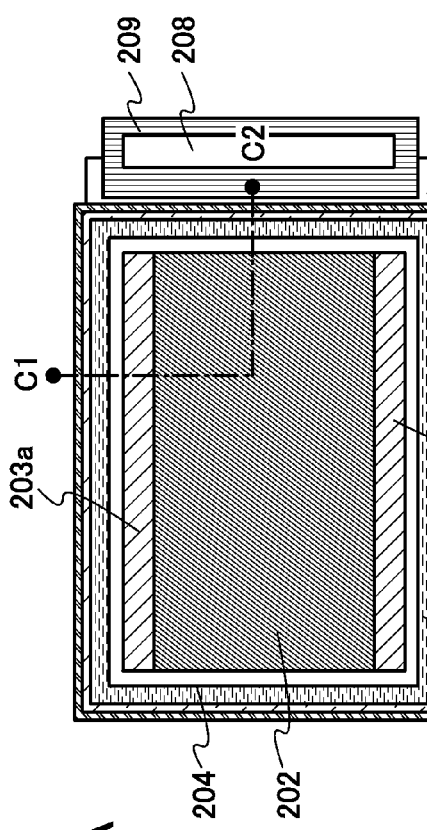
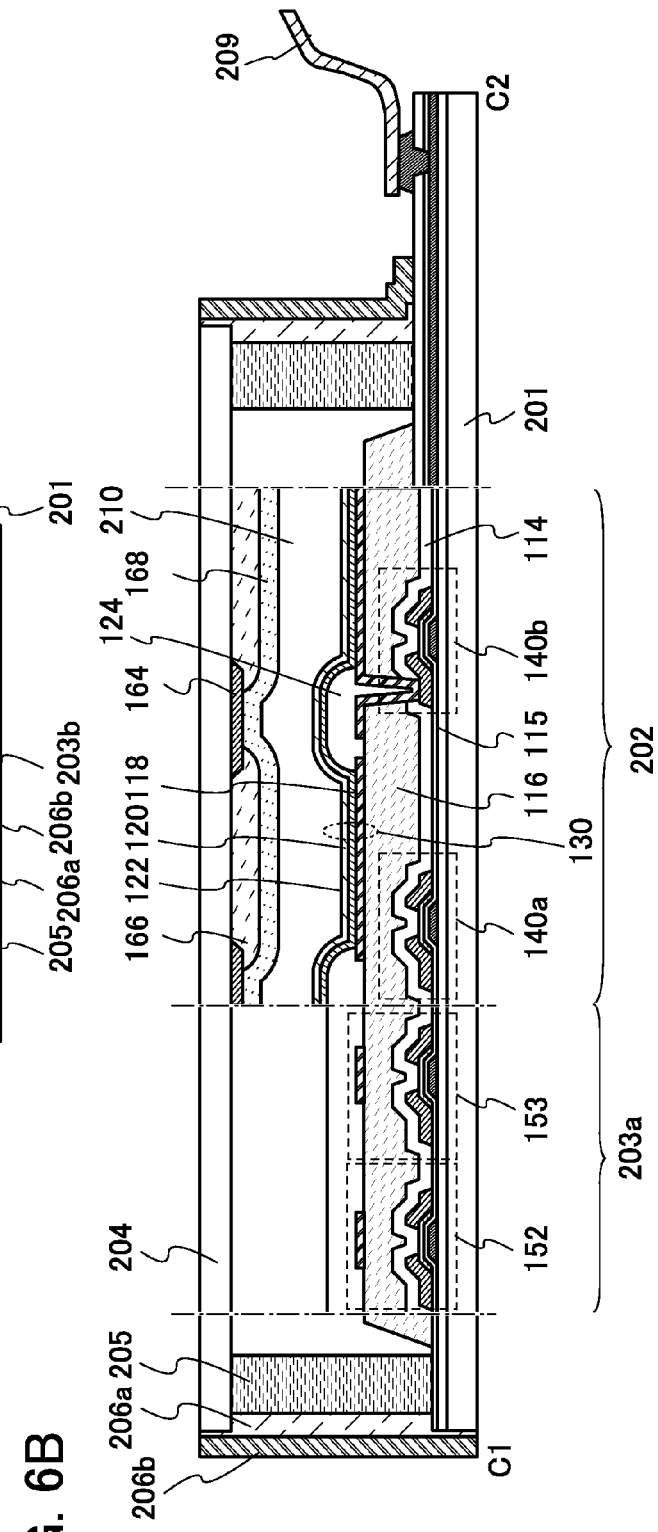

DISPLAY DEVICE HAVING PLURAL SEALANTS AT PERIPHERY OF PIXEL PORTION

BACKGROUND OF THE INVENTION

1. Field of the Invention

The present invention relates to a display device and a manufacturing method thereof.

2. Description of the Related Art

In recent years, techniques for improvement in performance (e.g., reduction in power consumption or increase in definition) of a display device have been developed.

Examples of the display device include a liquid crystal display device, an electroluminescent display device (also referred to as an EL display device), and the like.

As a transistor for driving a display element (a liquid crystal element, an EL element, or the like) in the display device, a transistor in which a channel formation region includes a silicon semiconductor, a transistor in which a channel formation region includes a metal oxide semiconductor, or the like can be used. For example, a display device disclosed in Patent Document 1 is an example of a display device including, as a transistor for driving a display element, a transistor in which a channel formation region includes a metal oxide semiconductor.

REFERENCE

Patent Document

[Patent Document 1] Japanese Published Patent Application No. 2011-44699

SUMMARY OF THE INVENTION

A conventional display device has a problem of low reliability. For example, in a conventional display device, a display element is provided between two substrates, and further, a sealant is provided between the two substrates so as to surround the display element. By attaching the two substrates to each other, the display element is sealed. However, entry of water or the like from the outside through the sealant into a sealed region degrades the characteristics of the display element or a transistor for driving the display element; thus, a malfunction is likely to occur.

In a region where the two substrates overlap with each other of the display device, a region other than a display portion (also referred to as a frame), such as a region overlapping with the sealant, is preferably small. When the frame is wide, for example, the area occupied by the display portion becomes small.

Further, in the case where an EL element is used as the display element, there is a problem in that reliability is impaired by entry of impurities such as moisture and oxygen from the outside.

In view of the above problems, an object of one embodiment of the present invention is to provide a highly reliable display device. Another object is to provide a display device with a narrow frame. One embodiment of the present invention solves at least one of the above problems.

A display device according to one embodiment of the present invention includes: a first substrate and a second substrate facing each other; a pixel portion including a display element, between the first substrate and the second substrate; a first sealant provided around a periphery of the pixel portion; and a second sealant which is in contact with at least one of a side surface of the first substrate and a side surface of the second substrate and with which a gap between the first substrate and the second substrate is filled.

In the above structure, the second sealant preferably has lower moisture permeability than the first sealant.

In the above structure, the first sealant is preferably a resin layer, and the second sealant is preferably a metal layer.

A display device according to another embodiment of the present invention includes: a first substrate and a second substrate facing each other; a pixel portion including a display element, between the first substrate and the second substrate; a first sealant provided around a periphery of the pixel portion; a second sealant which is in contact with at least one of a side surface of the first substrate and a side surface of the second substrate and with which a gap between the first substrate and the second substrate is filled; and a third sealant overlapping with a side surface of the first sealant and at least one of the side surface of the first substrate and the side surface of the second substrate with the second sealant interposed therebetween.

In the above structure, the third sealant preferably has lower moisture permeability than the first sealant and the second sealant. Further, the third sealant is preferably a metal layer or a thermoplastic resin.

In the above structure, the display element is preferably an organic EL element.

In the above structure, the pixel portion preferably includes a transistor, and in the transistor, a channel is preferably formed in an oxide semiconductor layer.

According to one embodiment of the present invention, a highly reliable display device can be provided. Further, a display device with a narrow frame can be provided.

BRIEF DESCRIPTION OF THE DRAWINGS

FIGS. 4A1, 4A2, 4B1, 4B2, 4C1, and 4C2 are top views and cross-sectional views illustrating a manufacturing process of a display device.

FIGS. 5A1, 5A2, 5B1, 5B2, 5C1, and 5C2 are top views and cross-sectional views illustrating a manufacturing process of a display device.

FIGS. 6A and 6B are a top view and a cross-sectional view of a light-emitting display device.

DETAILED DESCRIPTION OF THE INVENTION

Figure 1A:
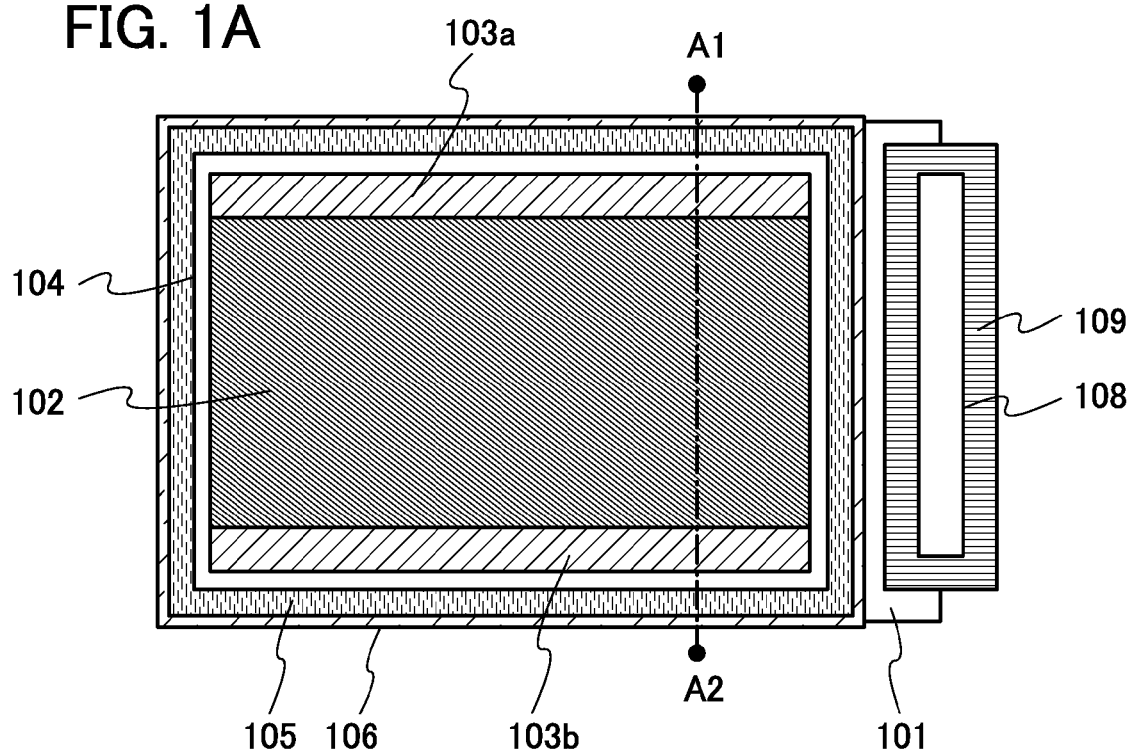
FIGS. 1A and 1B are a top view and a cross-sectional view of a display device.

Embodiments will be described in detail with reference to the accompanying drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments. Note that in the structures of the invention described below, the same portions or portions having similar functions are denoted by the same reference numerals in different drawings, and description of such portions is not repeated.

Embodiment 1

In this embodiment, a display device according to one embodiment of the present invention will be described with reference to FIGS. 1A and 1B, FIGS. 2A and 2B, and FIGS. 3A to 3C. In this specification and the like, a display device includes a light-emitting display device, a liquid crystal display device, and a display device including an electrophoretic element. A light-emitting display device includes a light-emitting element, and a liquid crystal display device includes a liquid crystal element. A light-emitting element includes, in its scope, an element whose luminance is controlled by current or voltage, and specifically includes an inorganic EL element, an organic EL element, and the like.

Figure 1B:
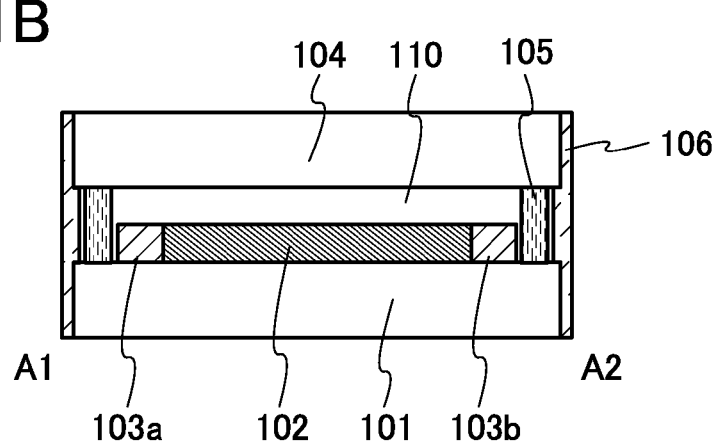

FIGS. 1A and 1B illustrate a display device according to one embodiment of the present invention. FIG. 1A is a top view of the display device, and FIG. 1B is a cross-sectional view taken along dashed-dotted line A1-A2 in FIG. 1A.

As illustrated in FIG. 1A, the display device includes a pixel portion 102 which includes a display element and is provided between a first substrate 101 and a second substrate 104 facing each other; driver circuit portions 103a and 103b; a first sealant 105 provided around the periphery of the pixel portion 102 and the driver circuit portions 103a and 103b; and a second sealant 106 which is in contact with at least one of a side surface of the first substrate 101 and a side surface of the second substrate 104 and with which a gap between the first substrate 101 and the second substrate 104 is filled. Further, in the display device, a space 110 surrounded by the first substrate 101, the second substrate 104, and the first sealant 105 is provided.

The display element in the pixel portion 102 is degraded if entry of an impurity such as water occurs. In the case where an organic EL element is used as the display element, the lifetime of the organic EL element is significantly shortened if water or the like enters an organic compound or a metal material included in the organic EL element. This is because the organic compound or the metal material included in the organic EL element reacts with an impurity such as water to be degraded. Further, electric characteristics of a transistor controlling the display element or a transistor in the driver circuit portion 103a or 103b might change when an impurity enters a semiconductor layer. For example, in the case where an oxide semiconductor layer is used as a semiconductor layer where a channel of a transistor is formed, electric characteristics might change owing to entry of an impurity into the oxide semiconductor layer. These cause a reduction in the reliability of a display device.

In view of the above, as illustrated in FIGS. 1A and 1B, in addition to the first sealant 105 with which the first substrate 101 and the second substrate 104 are attached to each other, the second sealant 106 which is in contact with at least one of the side surface of the first substrate 101 and the side surface of the second substrate 104 and with which the gap between the first substrate 101 and the second substrate 104 is filled is provided. At least one of the first sealant 105 and the second sealant 106 preferably has low moisture permeability. Further, the second sealant 106 preferably has lower moisture permeability than the first sealant 105. With the use of a material having low moisture permeability for at least one of the first sealant 105 and the second sealant 106, entry of a substance (e.g., water) serving as an impurity for the display element or the transistor through the first sealant 105 and the second sealant 106 can be prevented. Accordingly, the reliability of the display device can be improved.

Here, the "moisture permeability" refers to the mass of moisture permeating a material such as a film with a unit area of 1 $m^2$ per day (unit: $g/m^2 \cdot day$). By making the moisture permeability low, entry of an impurity such as water or moisture from the outside can be prevented or suppressed.

The moisture permeability can be calculated by a moisture permeability test called a MOCON method or a cup method. The MOCON method refers to a method in which water vapor permeating a measurement target material is measured using an infrared sensor. The cup method refers to a method in which moisture permeability is measured from a change in the weight of a moisture absorbent which is placed in a cup and absorbs water vapor that has permeated a measurement target material.

The moisture permeability of a sealant commercially available for use in a light-emitting device, for example, is 16 $g/m^2 \cdot day$ in the case where the thickness thereof is 100 μm. In the case where a glass layer formed using glass frit is used as a sealant, the moisture permeability of the sealant is 0.01 $g/m^2 \cdot day$ or less. With the use of a sealing structure according to one embodiment of the present invention, the moisture permeability of a display device can be lower than or equal to the above value.

By providing the second sealant 106 in contact with at least one of the side surface of the first substrate 101 and the side surface of the second substrate 104 so that the gap between the first substrate 101 and the second substrate 104 is filled, the frame can be made narrow as compared to the case where the first sealant 105 and the second sealant 106 are provided between the first substrate 101 and the second substrate 104.

Note that the case where the second sealant 106 is provided so as to surround the second substrate 104 is described below; however, one embodiment of the present invention is not limited to this. For example, a structure may alternatively be employed in which the second sealant 106 is not formed in an offset region where the first substrate 101 does not face the second substrate 104.

First Structural Example

A first structural example of a display device according to one embodiment of the present invention will be described with reference to FIGS. 1A and 1B. For example, a glass layer is used for the first sealant 105. The glass layer can be formed using glass frit. The glass layer is preferably used for the first sealant 105 because a high effect of sealing can be obtained.

The glass frit contains one or more elements such as magnesium, calcium, boron, vanadium, zinc, tellurium, aluminum, silicon, lead, tin, phosphorus, ruthenium, rhodium, iron, copper, manganese, molybdenum, niobium, titanium, tungsten, bismuth, zirconium, lithium, and antimony, for example.

The glass frit contains a glass material as a frit material. As the frit material, for example, one or more of the following can be used: magnesium oxide, calcium oxide, boron oxide, vanadium oxide, zinc oxide, tellurium oxide, aluminum oxide, silicon dioxide, lead oxide, tin oxide, phosphorus oxide, ruthenium oxide, rhodium oxide, iron oxide, copper oxide, manganese dioxide, molybdenum oxide, niobium oxide, titanium oxide, tungsten oxide, bismuth oxide, zirconium oxide, lithium oxide, and antimony oxide. Alternatively, as the frit material, for example, one or more of the following can be used: lead borate glass, tin phosphate glass, vanadate glass, and borosilicate glass. The glass frit preferably contains one or more kinds of transition metals to absorb infrared light.

In the case where the glass layer is used for the first sealant 105, paste-like glass frit (frit paste) is applied to the first substrate 101 or the second substrate 104. The frit paste contains the frit material and a resin (also referred to as a binder) diluted with an organic solvent. For the frit paste, a known material and a known composition can be used. For example, terpineol, n-butyl carbitol acetate, or the like can be used as the organic solvent, and ethylcellulose or the like can be used as the resin. An absorber which absorbs light having a wavelength of laser light may be added to the frit material.

Here, the thermal expansion coefficient of the glass layer used for the first sealant 105 is preferably close to those of the first substrate 101 and the second substrate 104. As the thermal expansion coefficients are closer to each other, generation of a crack in the glass layer or the substrate due to thermal stress can be suppressed.

An effect of sealing cannot be sufficiently obtained in some cases where the glass layer formed using the glass frit does not have sufficient adhesion strength with respect to the substrate or a film in contact with the glass layer. In such a case, an impurity such as water might enter the pixel portion 102 or the driver circuit portions 103a and 103b from the interface between the glass layer and the substrate or the film.

In view of this, the second sealant 106 is provided in contact with both the side surface of the first substrate 101 and the side surface of the second substrate 104 so that the gap between the first substrate 101 and the second substrate 104 is filled. Although the second sealant 106 is in contact with both the side surface of the first substrate 101 and the side surface of the second substrate 104 in the example in FIG. 1B, one embodiment of the present invention is not limited to this example as long as the second sealant 106 is in contact with at least one of the side surface of the first substrate 101 and the side surface of the second substrate 104.

For example, a metal layer, a thermoplastic resin, or the like can be used for the second sealant 106. As the metal layer, for example, a metal material containing aluminum, lead, nickel, or the like, or an alloy material containing such a metal material can be used. For example, stainless steel can also be used. As the thermoplastic resin, for example, one or a combination of the following can be used: polyethylene, polypropylene, polyvinyl chloride, polyvinylidene chloride, polystyrene, polyvinyl acetate, polytetrafluoroethylene, an ABS resin, an AS resin, an acrylic resin, and the like. With the use of the metal layer or the thermoplastic resin for the second sealant 106, mechanical strength can be increased.

The metal layer may be directly formed on the side surfaces of the first substrate 101 and the second substrate 104 or in the gap between the first substrate 101 and the second substrate 104 by a soldering method or a sputtering method. In the case where solder is used for the metal layer, the melting point of the solder is preferably lower than that of the first sealant 105. Note that metal foil, a metal substrate, or a thermoplastic resin may be attached to the side surfaces of the first substrate 101 and the second substrate 104 with an adhesive resin layer interposed therebetween. In this case, the adhesive resin layer is preferably provided on the side surfaces of the first substrate 101 and the second substrate 104 or in the gap between the first substrate 101 and the second substrate 104.

Note that the total width of the first sealant 105 and the second sealant 106 is 1 mm or less, preferably 0.5 mm or less.

In this manner, by providing the second sealant 106 in contact with at least one of the side surface of the first substrate 101 and the side surface of the second substrate 104 so that the gap between the first substrate 101 and the second substrate 104 is filled, the adhesion strength between the first substrate 101 and the second substrate 104 can be increased and an effect of sealing can be increased. Further, when the moisture permeability of a material used for the second sealant 106 is lower than the moisture permeability of a material used for the first sealant 105, an impurity such as water can be prevented from entering the display element or the transistor. Accordingly, the reliability of the display device can be improved.

By providing the second sealant 106 in contact with at least one of the side surface of the first substrate 101 and the side surface of the second substrate 104 so that the gap between the first substrate 101 and the second substrate 104 is filled, the frame can be made narrow as compared to the case where the first sealant 105 and the second sealant 106 are provided between the first substrate 101 and the second substrate 104.

Second Structural Example

A second structural example of the display device according to one embodiment of the present invention will be described with reference to FIGS. 1A and 1B. For example, a resin layer is used for the first sealant 105. The resin layer can be formed using a photocurable resin such as an ultraviolet curable resin, a thermosetting resin, a photocurable and thermosetting resin, or the like. As the photocurable resin, an acrylic resin, an epoxy resin, an amine resin, or the like can be used. As the photocurable and thermosetting resin, a resin in which an acrylic resin and an epoxy resin are mixed can be used. The photocurable resin is preferably used because, for example, a high-temperature heat that degrades the display element or changes the transistor characteristics can be prevented from being applied. When the resin layer is used for the first sealant 105, adhesiveness and impact resistance can be improved.

The sealing property of the resin layer is such that it is difficult to block an impurity such as water compared to that of a glass layer. In such a case, an impurity such as water might enter the pixel portion 102 or the driver circuit portions 103a and 103b through the resin layer.

In view of this, the second sealant 106 is provided in contact with at least one of a side surface of the first substrate 101 and a side surface of the second substrate 104 so that a gap between the first substrate 101 and the second substrate 104 is filled. For example, the above glass layer can be used for the second sealant 106.

Alternatively, the above metal layer or thermoplastic resin can be used for the second sealant 106. With the use of the metal layer or the thermoplastic resin for the second sealant 106, mechanical strength can be increased.

Note that the total width of the first sealant 105 and the second sealant 106 is 1 mm or less, preferably 0.5 mm or less.

In this manner, by providing the second sealant 106 in contact with at least one of the side surface of the first substrate 101 and the side surface of the second substrate 104 so that the gap between the first substrate 101 and the second substrate 104 is filled, the adhesion strength between the first substrate 101 and the second substrate 104 can be increased and an effect of sealing can be increased. Further, when the moisture permeability of a material used for the second sealant 106 is lower than the moisture permeability of a material used for the first sealant 105, an impurity such as water can be prevented from entering the display element or the transistor. Accordingly, the reliability of the display device can be improved.

By providing the second sealant 106 in contact with at least one of the side surface of the first substrate 101 and the side surface of the second substrate 104 so that the gap between the first substrate 101 and the second substrate 104 is filled, the frame can be made narrow as compared to the case where the first sealant 105 and the second sealant 106 are provided between the first substrate 101 and the second substrate 104.

In FIGS. 1A and 1B, a driver circuit portion 108 is mounted in a region that is different from a region surrounded by the first sealant 105 and the second sealant 106 over the first substrate 101. An IC chip, a chip in which a single crystal semiconductor film or a polycrystalline semiconductor film is formed over a substrate separately prepared, or the like may be used as the driver circuit portion 108. In FIGS. 1A and 1B, various signals and potentials are supplied to the pixel portion 102 from an FPC 109 through the driver circuit portion 108 and the driver circuit portions 103a and 103b.

In the example illustrated in FIGS. 1A and 1B, the pixel portion 102 and the driver circuit portions 103a and 103b are sealed by the first sealant 105 and the second sealant 106; however, one embodiment of the present invention is not limited to this. Only the pixel portion 102 may be sealed by the first sealant 105 and the second sealant 106. Alternatively, the pixel portion 102, the driver circuit portions 103a and 103b, and the driver circuit portion 108 may be sealed by the first sealant 105 and the second sealant 106.

In the example illustrated in FIGS. 1A and 1B, the driver circuit portion 108 is separately prepared and is mounted over the first substrate 101; however, one embodiment of the present invention is not limited to this example. For example, the driver circuit portions 103a and 103b may be separately formed and mounted; alternatively, only part of the driver circuit portions 103a and 103b or only part of the driver circuit portion 108 may be separately formed and mounted.

Figure 2A:
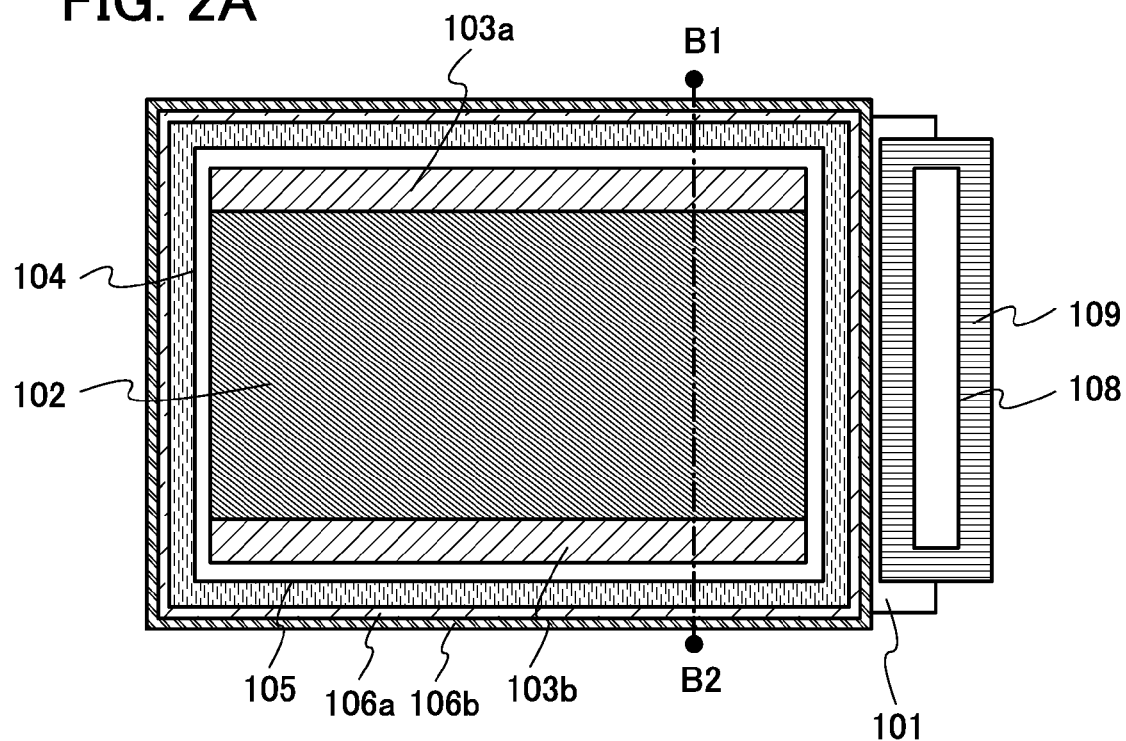
FIGS. 2A and 2B are a top view and a cross-sectional view of a display device.
Figure 2B:
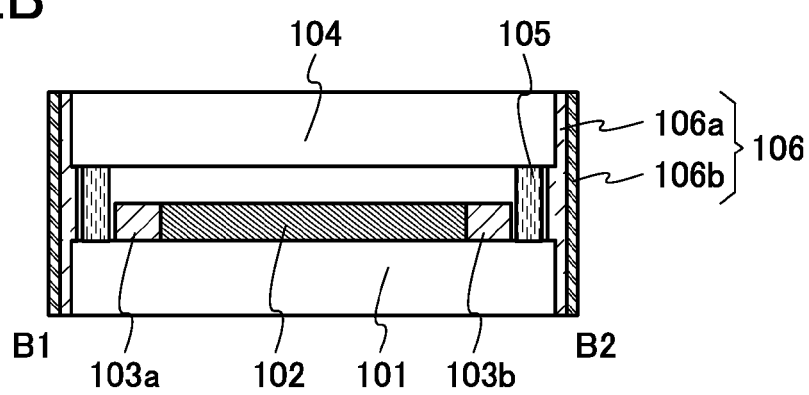

Further, as illustrated in FIGS. 2A and 2B, the second sealant 106 may have a two-layer structure. FIGS. 2A and 2B illustrate a display device in which the second sealant 106 has a two-layer structure. FIG. 2A is a top view of the display device, and FIG. 2B is a cross-sectional view taken along dashed-dotted line B1-B2 in FIG. 2A.

As illustrated in FIG. 2A, the display device includes the pixel portion 102 which includes a display element and is provided between the first substrate 101 and the second substrate 104 facing each other; the driver circuit portions 103a and 103b; the first sealant 105 provided around the periphery of the pixel portion 102 and the driver circuit portions 103a and 103b; a second sealant 106a which is in contact with at least one of a side surface of the first substrate 101 and a side surface of the second substrate 104 and with which a gap between the first substrate 101 and the second substrate 104 is filled; and a second sealant 106b (also referred to as a third sealant) which overlaps with a side surface of the first sealant 105 and at least one of the side surface of the first substrate 101 and the side surface of the second substrate 104 with the second sealant 106a interposed therebetween.

At least one of the first sealant 105, the second sealant 106a, and the second sealant 106b preferably has low moisture permeability. Further, the second sealant 106b preferably has lower moisture permeability than the first sealant 105 and the second sealant 106a. With the use of a material having low moisture permeability for at least one of the first sealant 105, the second sealant 106a, and the second sealant 106b, entry of a substance (e.g., water) serving as an impurity for the display element or the transistor through the first sealant 105 and the second sealant 106 can be prevented. Accordingly, the reliability of the display device can be improved.

Third Structural Example

A third structural example of the display device according to one embodiment of the present invention will be described with reference to FIGS. 2A and 2B. For example, the above glass layer can be used for the first sealant 105. Further, for example, the above resin layer can be used for the second sealant 106a, and the above metal layer or thermoplastic resin can be used for the second sealant 106b.

Fourth Structural Example

A fourth structural example of the display device according to one embodiment of the present invention will be described with reference to FIGS. 2A and 2B. For example, the above resin layer can be used for the first sealant 105. Further, for example, the above glass layer can be used for the second sealant 106a, and the above metal layer or thermoplastic resin can be used for the second sealant 106b.

In this manner, by providing the second sealant 106a in contact with at least one of a side surface of the first substrate 101 and a side surface of the second substrate 104 so that a gap between the first substrate 101 and the second substrate 104 is filled, the adhesion strength between the first substrate 101 and the second substrate 104 can be increased. Further, when the moisture permeability of a material used for the second sealant 106b is lower than the moisture permeability of a material used for the first sealant 105, an impurity such as water can be prevented from entering the display element or the transistor. Accordingly, the reliability of the display device can be improved.

By providing the second sealant 106a in contact with at least one of the side surface of the first substrate 101 and the side surface of the second substrate 104 so that the gap between the first substrate 101 and the second substrate 104 is filled, the frame can be made narrow as compared to the case where the first sealant 105 and the second sealant 106a are provided between the first substrate 101 and the second substrate 104.

Figure 3A:
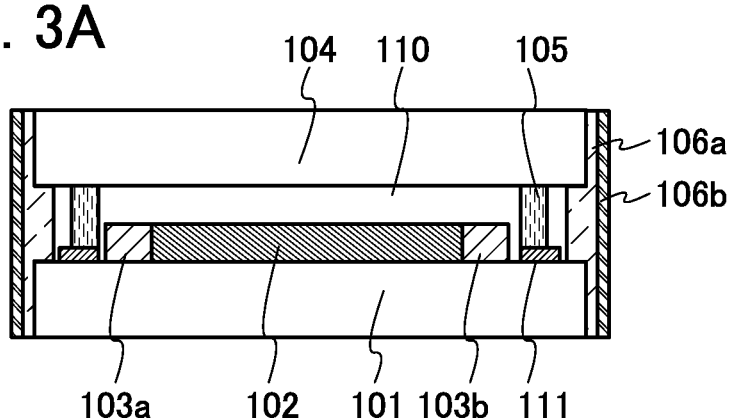
FIGS. 3A to 3C are each a cross-sectional view of a display device.

FIG. 3A illustrates an example which is partly different from the third structural example.

In the case where the glass layer is used for the first sealant 105, a metal layer serving as a dummy pattern 111 may be formed over the first substrate 101 as illustrated in FIG. 3A. After a frit paste is applied to the metal layer and is irradiated with laser light to be pre-baked, the first substrate 101 and the second substrate 104 are attached to each other. Next, laser irradiation is performed from the second substrate 104 side so that laser light is absorbed by the dummy pattern 111; thus, the dummy pattern 111 is heated. The frit paste becomes a glass layer by the laser irradiation and heat generated in the dummy pattern 111. The dummy pattern 111 can be formed through the same steps as a wiring in transistors in the pixel portion 102 or in transistors in the driver circuit portions 103a and 103b. Note that the first sealant 105 overlaps with at least part of the dummy pattern 111 as illustrated in FIG. 3A.

As the metal layer serving as the dummy pattern 111, a layer which contains a metal element such as silver, gold, platinum, nickel, tungsten, chromium, molybdenum, iron, cobalt, copper, palladium, aluminum, manganese, titanium, or tantalum, a layer which contains an alloy containing one or more of these metal elements, or the like can be used. Note that the metal layer serving as the dummy pattern 111 can be any layer that contains a metal element and has lower laser light transmittance than the second substrate 104; an oxide film, a nitride film, or an oxynitride film of any of the above metal elements can be used. When the dummy pattern 111 has a layered structure of the metal layer and a silicon oxide film, the adhesiveness between the glass frit and the silicon oxide film can be improved.

Figure 3B:
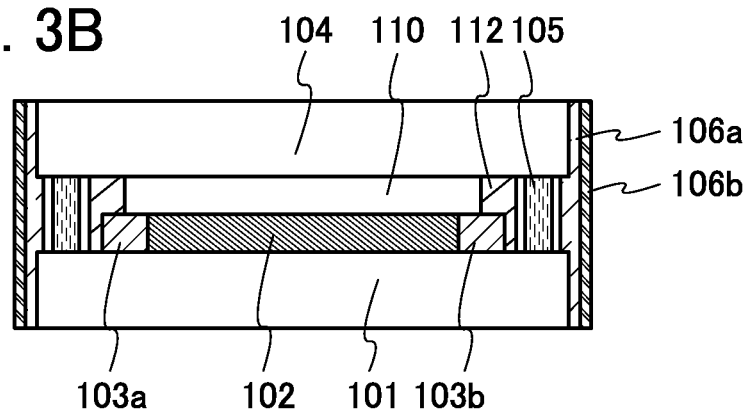

FIG. 3B illustrates an example which is partly different from the third structural example and the fourth structural example.

As illustrated in FIG. 3B, a sealant 112 may be further provided so as to overlap with the driver circuit portions 103a and 103b. In the case where the sealant 112 is provided in contact with the driver circuit portions 103a and 103b, it is preferable that heat be not applied to the driver circuit portions 103a and 103b and the pixel portion 102 during the formation of the sealant 112. Therefore, a photocurable resin is preferably used for the sealant 112. In the case where the sealant 112 is provided in contact with the driver circuit portions 103a and 103b, the first sealant 105 is not necessarily provided. As illustrated in FIG. 3B, the sealant 112 may overlap with part of the driver circuit portion 103a, or may cover the whole driver circuit portion 103a. Further, the sealant 112 may overlap with part of the driver circuit portion 103b, or may cover the whole driver circuit portion 103b.

Figure 3C:
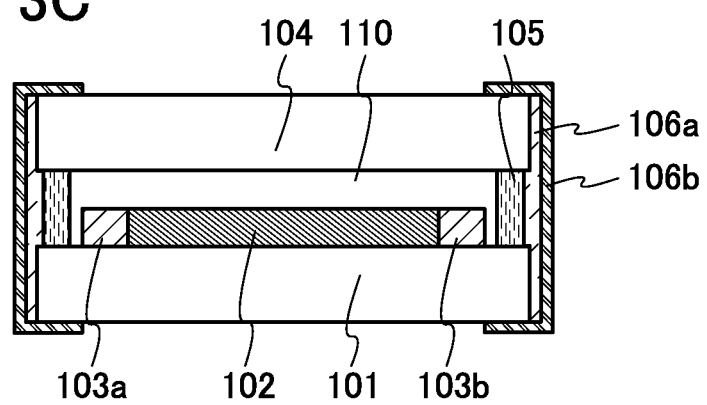

FIG. 3C illustrates an example which is partly different from the third structural example and the fourth structural example.

The second sealant 106b illustrated in FIG. 3C is provided around the periphery of the second sealant 106a and in contact with the first substrate 101 and the second substrate 104. With such a structure, an impurity such as water can be prevented from entering the pixel portion 102 and the driver circuit portions 103a and 103b from an exposed portion of the exposed second sealant 106a. Although the second sealant 106 is in contact with both the first substrate 101 and the second substrate 104 in the example in FIG. 3C, one embodiment of the present invention is not limited to this example as long as the second sealant 106 is in contact with at least one of the first substrate 101 and the second substrate 104.

In this manner, by providing the second sealant 106 in contact with at least one of the side surface of the first substrate 101 and the side surface of the second substrate 104 so that the gap between the first substrate 101 and the second substrate 104 is filled, the adhesion strength between the first substrate 101 and the second substrate 104 can be increased. Further, when the moisture permeability of a material used for the second sealant 106 is lower than the moisture permeability of a material used for the first sealant 105, an impurity such as water can be prevented from entering the display element or the transistor. Accordingly, the reliability of the display device can be improved.

By providing the second sealant 106 in contact with at least one of the side surface of the first substrate 101 and the side surface of the second substrate 104 so that the gap between the first substrate 101 and the second substrate 104 is filled, the frame can be made narrow as compared to the case where the first sealant 105 and the second sealant 106 are provided between the first substrate 101 and the second substrate 104.

Embodiment 2

In this embodiment, a manufacturing method of a display device according to one embodiment of the present invention will be described with reference to FIGS. 4A1, 4A2, 4B1, 4B2, 4C1, and 4C2 and FIGS. 5A1, 5A2, 5B1, 5B2, 5C1, and 5C2. In particular, the display device illustrated in FIGS. 2A and 2B will be described as an example.

<Manufacturing Method of Third Structural Example>

First, a manufacturing method of the third structural example of the display device illustrated in FIGS. 2A and 2B will be described with reference to FIGS. 4A1, 4A2, 4B1, 4B2, 4C1, and 4C2 and FIGS. 5A1, 5A2, 5B1, 5B2, 5C1, and 5C2. First, the pixel portion 102 and the driver circuit portions 103a and 103b are formed over the first substrate 101 (see FIGS. 4A1 and 4A2). Specifically, a display element in the pixel portion 102, and transistors in the driver circuit portions 103a and 103b such as a transistor controlling the display element are formed.

Next, the first sealant 105 is formed over the second substrate 104 (see FIGS. 4B1 and 4B2). The first sealant 105 is provided so as to surround the pixel portion 102 and the driver circuit portions 103a and 103b when the second substrate 104 faces the first substrate 101. The first sealant 105 is preferably formed in an inert atmosphere (e.g., a rare gas atmosphere or a nitrogen atmosphere) or under reduced pressure. In the case where the first sealant 105 is formed in an environment where a large amount of impurities such as water is contained, e.g., in the air, heat treatment as dehydration treatment is preferably performed after the formation of the first sealant 105. In this manufacturing method, a photocurable resin is used for the first sealant 105.

Next, the first substrate 101 and the second substrate 104 are attached to each other (see FIGS. 4C1 and 4C2). The first substrate 101 and the second substrate 104 are attached to each other such that the first sealant 105 is closely in contact with the substrates.

The above step of attaching the substrates is performed in an inert atmosphere (e.g., a rare gas atmosphere or a nitrogen atmosphere) or under reduced pressure. Accordingly, an impurity such as water is less likely to be contained in the space 110. The above step of attaching the substrates is preferably performed while the external pressure is applied. In this manufacturing method, the above step of attaching the substrates is performed under reduced pressure.

Then, the photocurable resin is irradiated with light to be cured, so that a resin layer is formed. The light irradiation may be performed from the first substrate 101 side or the second substrate 104 side. Further, a shielding plate is preferably used so that the pixel portion 102 and the like are prevented from being irradiated with ultraviolet light.

Next, the second sealant 106a and the second sealant 106b are formed. The second sealant 106a is in contact with side surfaces of the first substrate 101 and the second substrate 104 and fills a gap between the first substrate 101 and the second substrate 104, and the second sealant 106b overlaps with a side surface of the first sealant 105 and the side surfaces of the first substrate 101 and the second substrate 104 with the second sealant 106a interposed therebetween (see FIGS. 5A1 and 5A2).

In this manufacturing method, glass frit is used for the second sealant 106a. The second sealant 106a can be formed in such a manner that the glass frit is made into paste form and the frit paste is dropped into the gap between the first substrate 101 and the second substrate 104 by a dispensing method. The gap between the first substrate 101 and the second substrate 104 is filled with the frit paste through capillary action.

Here, the frit paste is heated (pre-baking is performed). At this time, the heating temperature is preferably close to the glass transition point of the glass frit that is used. For example, the heating temperature can be approximately 300° C. to 400° C.

A metal layer is used for the second sealant 106b. As the second sealant 106b, a foil-like metal material may be attached to the second sealant 106a. Alternatively, as the second sealant 106b, a metal material may be deposited on the second sealant 106a by a sputtering method. Further alternatively, as the second sealant 106b, a metal material may be applied to the second sealant 106a by a soldering method. In this manufacturing method, a metal material is applied to the second sealant 106a by a soldering method.

Then, the second sealants 106a and 106b are subjected to laser irradiation (see FIGS. 5B1 and 5B2). In this embodiment, laser irradiation is performed on the second sealants 106a and 106b from the direction toward the side surfaces of the first substrate 101 and the second substrate 104; thus, the frit paste is heated (main baking is performed) so that a glass layer is formed as the second sealant 106a. Here, it is preferable that the first sealant 105 and the second sealant 106a be not in contact with each other in order that the first sealant 105 can be prevented from being damaged by heat applied thereto through laser irradiation (in order that the resin layer used as the first sealant 105 can be prevented from being degraded).

Next, the FPC 109 to which the driver circuit portion 108 is connected is attached to a terminal portion using an anisotropic conductive layer (see FIGS. 5C1 and 5C2).

Through the above-described steps, the display device can be manufactured.

<Manufacturing Method of Fourth Structural Example>

First, a manufacturing method of the fourth structural example of the display device illustrated in FIGS. 2A and 2B will be described with reference to FIGS. 4A1, 4A2, 4B1, 4B2, 4C1, and 4C2 and FIGS. 5A1, 5A2, 5B1, 5B2, 5C1, and 5C2. First, as in the manufacturing method of the third structural example, the pixel portion 102 and the driver circuit portions 103a and 103b are formed over the first substrate 101 (see FIGS. 4A1 and 4A2). Specifically, a display element in the pixel portion 102, and transistors in the driver circuit portions 103a and 103b such as a transistor controlling the display element are formed.

Next, the first sealant 105 is formed over the second substrate 104 (see FIGS. 4B1 and 4B2). The first sealant 105 is provided so as to surround the pixel portion 102 and the driver circuit portions 103a and 103b when the second substrate 104 faces the first substrate 101. In this manufacturing method, glass frit is used for the first sealant 105. The first sealant 105 is formed in such a manner that paste-like glass frit is applied to the second substrate 104 by a printing method such as a screen printing method, a dispensing method, or the like.

Here, the frit paste is heated (pre-baking is performed). At this time, the heating temperature is preferably close to the glass transition point of the glass frit that is used. For example, the heating temperature can be approximately 300° C. to 400° C.

In the case where a glass layer is used for the first sealant 105, a top surface of the glass layer is preferably planarized. By planarizing the top surface of the glass layer, the adhesiveness to the second substrate 104 can be improved. To planarize the top surface of the glass layer, pressure treatment may be performed. The pressure treatment can be performed before or after the pre-baking.

Next, the first substrate 101 and the second substrate 104 are attached to each other (see FIGS. 4C1 and 4C2). The first substrate 101 and the second substrate 104 are attached to each other such that the first sealant 105 is closely in contact with the substrates.

Next, the first sealant 105 is subjected to laser irradiation (not illustrated). By performing laser irradiation on the first sealant 105, the frit paste is heated (main baking is performed) so that the glass layer is formed as the first sealant 105. Note that the laser irradiation may be performed from the direction perpendicular to the first substrate 101 or the second substrate 104, or may be performed from the direction parallel to the first substrate 101 and the second substrate 104 (from the direction toward the side surfaces of the substrates).

In the case where the laser irradiation is performed from the direction parallel to the first substrate 101 and the second substrate 104, the laser irradiation may be performed at an angle of 10° to 45° with respect to the first substrate 101 as a reference surface. At this time, by providing a film reflecting laser light in the driver circuit portions 103a and 103b, laser irradiation can be efficiently performed on the glass frit. By reflecting laser light, damage to the display element and the transistors in the pixel portion 102 can be reduced.

Next, the second sealant 106a and the second sealant 106b are formed. The second sealant 106a is in contact with the side surfaces of the first substrate 101 and the second substrate 104 and fills the gap between the first substrate 101 and the second substrate 104, and the second sealant 106b overlaps with a side surface of the first sealant 105 and the side surfaces of the first substrate 101 and the second substrate 104 with the second sealant 106a interposed therebetween (see FIGS. 5A1 and 5A2).

In this manufacturing method, a resin layer is used for the second sealant 106a. The second sealant 106b can be formed in such a manner that a liquid resin is dropped into a gap between the first substrate 101 and the second substrate 104 by a dispensing method. The gap between the first substrate 101 and the second substrate 104 is filled with the liquid resin through capillary action.

In the case where a photocurable resin is used as a resin, the photocurable resin is irradiated with light to be cured, so that a resin layer is formed. Alternatively, in the case where a thermosetting resin is used, heat is applied to the thermosetting resin in order that the thermosetting resin is cured; thus, a resin layer is formed.

A metal layer is used for the second sealant 106b. As the second sealant 106b, a foil-like metal material may be attached to the second sealant 106a. Alternatively, as the second sealant 106b, a metal material may be deposited on the second sealant 106a by a sputtering method. Further alternatively, as the second sealant 106b, a metal material may be applied to the second sealant 106a by a soldering method. In this manufacturing method, a foil-like metal material is attached to the second sealant 106a.

Next, the FPC 109 to which the driver circuit portion 108 is connected is attached to a terminal portion using an anisotropic conductive layer (see FIGS. 5C1 and 5C2).

Through the above-described steps, the display device can be manufactured.

By providing the second sealant 106 in contact with at least one of the side surface of the first substrate 101 and the side surface of the second substrate 104 so that the gap between the first substrate 101 and the second substrate 104 is filled, the adhesion strength between the first substrate 101 and the second substrate 104 can be increased. Further, when the moisture permeability of a material used for the second sealant 106 is lower than the moisture permeability of a material used for the first sealant 105, an impurity such as water can be prevented from entering the display element or the transistor. Accordingly, the reliability of the display device can be improved.

By providing the second sealant 106 in contact with at least one of the side surface of the first substrate 101 and the side surface of the second substrate 104 so that the gap between the first substrate 101 and the second substrate 104 is filled, the frame can be made narrow as compared to the case where the first sealant 105 and the second sealant 106 are provided between the first substrate 101 and the second substrate 104.

Embodiment 3

In this embodiment, a light-emitting display device according to one embodiment of the present invention will be described with reference to FIGS. 6A and 6B.

FIGS. 6A and 6B illustrate a light-emitting display device according to one embodiment of the present invention. FIG.

6A is a top view of the light-emitting display device, and FIG. 6B is a cross-sectional view taken along dashed-dotted line B1-B2 in FIG. 6A.

In the active matrix light-emitting display device according to one embodiment of the present invention, a pixel portion 202 and scan line driver circuit portions 203a and 203b are provided between a first substrate 201 and a second substrate 204. A first sealant 205 is provided around the periphery of the pixel portion 202 and the scan line driver circuit portions 203a and 203b. A gap between the first substrate 201 and the second substrate 204 is filled with a second sealant 206a. The second sealant 206a is in contact with side surfaces of the first substrate 201 and the second substrate 204. A second sealant 206b (also referred to as a third sealant) overlaps with a side surface of the first sealant 205 and the side surfaces of the first substrate 201 and the second substrate 204 with the second sealant 206a interposed therebetween. Further, a space 210 surrounded by the first substrate 201, the second substrate 204, and the first sealant 205 is provided.

For the first sealant 205 and the second sealants 206a and 206b, the description of the first sealant 105 and the second sealants 106a and 106b in Embodiments 1 and 2 can be referred to; thus, the detailed description of the first sealant 205 and the second sealants 206a and 206b is omitted here.

In FIGS. 6A and 6B, a signal line driver circuit portion 208 is mounted in a region that is different from a region surrounded by the first sealant 205, the second sealants 206a, and the third sealant 206b over the first substrate 201. An IC chip, a chip in which a single crystal semiconductor film or a polycrystalline semiconductor film is formed over a substrate separately prepared, or the like may be used as the signal line driver circuit portion 208. In FIGS. 6A and 6B, various signals and potentials are supplied to the pixel portion 202 from an FPC 209 through the signal line driver circuit portion 208 and the scan line driver circuit portions 203a and 203b.

In the example illustrated in FIGS. 6A and 6B, the pixel portion 202 and the scan line driver circuit portions 203a and 203b are sealed by the first sealant 205, the second sealant 206a, and the third sealant 206b; however, one embodiment of the present invention is not limited to this. Only the pixel portion 202 may be sealed by the first sealant 205, the second sealant 206a, and the third sealant 206b. Alternatively, the pixel portion 202, the scan line driver circuit portions 203a and 203b, and the signal line driver circuit portion 208 may be sealed by the first sealant 205, the second sealant 206a, and the third sealant 206b.

In the example illustrated in FIGS. 6A and 6B, the signal line driver circuit portion 208 is separately prepared and is mounted over the first substrate 201; however, one embodiment of the present invention is not limited to this example. For example, the scan line driver circuit portions may be separately formed and mounted; alternatively, only part of the signal line driver circuit portion or only part of the scan line driver circuit portions may be separately formed and mounted.

As the first substrate 201 and the second substrate 204, for example, a glass substrate or the like can be used.

The pixel portion 202 includes a light-emitting unit including a switching transistor 140a, a current control transistor 140b, and a first electrode 118 electrically connected to a wiring (a source electrode or a drain electrode) of the current control transistor 140b. Further, an insulating layer 124 is provided so as to cover an end portion of the first electrode 118.

A light-emitting element 130 includes the first electrode 118, a layer containing a light-emitting organic compound (EL layer) 120, and a second electrode 122.

The scan line driver circuit portions 203a and 203b include a plurality of transistors. In FIGS. 6A and 6B, a transistor 152 and a transistor 153 are illustrated.

There is no particular limitation on the structure of a transistor that is provided in the light-emitting display device according to one embodiment of the present invention; for example, a staggered type or a planar type having a top-gate structure or a bottom-gate structure can be employed. Further, the transistor may have a single gate structure including one channel formation region, or a multi-gate structure such as a double gate structure including two channel formation regions or a triple gate structure including three channel formation regions. Further, the transistor may have a dual-gate structure including two gate electrode layers positioned above and below a semiconductor layer where a channel is formed with gate insulating films interposed therebetween. In this embodiment, a transistor having a bottom-gate structure is used for each of the transistors 140a and 140b in the pixel portion 202, and a transistor having a dual-gate structure is used for each of the transistors 152 and 153 in the scan line driver circuit portion 203a.

Here, the structures of the transistors 140a, 140b, 152, and 153 are described.

The gate electrode can be formed with a single-layer structure or a layered structure using any of metal materials such as molybdenum, titanium, chromium, tantalum, tungsten, aluminum, copper, neodymium, and scandium, or an alloy material which contains any of these elements by a plasma CVD method, a sputtering method, or the like.

A gate insulating layer 115 and an insulating layer 114 preferably have an effect of preventing diffusion of an impurity to a semiconductor in the transistors; for example, an inorganic insulating film of silicon oxide, silicon nitride, silicon oxynitride, silicon nitride oxide, aluminum oxide, aluminum nitride, aluminum oxynitride, aluminum nitride oxide, hafnium oxide, or the like formed by a plasma CVD method, a sputtering method, or the like can be used. Further, as an insulating layer 116, an oxide layer may be used. The oxide layer may be a layer of an oxide having an atomic ratio of In:Ga:Zn=1:3:2, for example. The gate insulating layer 115 and the insulating layer 114 can be formed to have a single-layer structure or a layered structure using any of the above materials.

In the case where an oxide semiconductor is used for the semiconductor layer, the insulating layers (the gate insulating layer 115 and the insulating layer 114) in contact with the oxide semiconductor layer preferably contain excess oxygen in order that the oxide semiconductor layer is supersaturated with oxygen.

For the insulating layers containing excess oxygen, a silicon oxide film or a silicon oxynitride film containing a large amount of oxygen by adjusting deposition conditions as appropriate in a plasma CVD method or a sputtering method is used. Alternatively, oxygen may be added by an ion implantation method, an ion doping method, or plasma treatment.

In addition, a blocking layer for suppressing release of oxygen from the oxide semiconductor layer is preferably provided so as to be positioned outside the insulating layers containing excess oxygen.

When the oxide semiconductor layer is surrounded by the insulating layers containing excess oxygen or the blocking layer, the oxygen content of the oxide semiconductor layer can be substantially the same as that of the stoichiometric composition, or can be in excess of that of the stoichiometric composition i.e., the oxide semiconductor layer can be supersaturated with oxygen.

An oxide semiconductor can be used for the semiconductor layer.

For example, an In-based metal oxide, a Zn-based metal oxide, an In—Zn-based metal oxide, an In—Ga—Zn-based metal oxide, or the like can be used as the oxide semiconductor. Alternatively, a metal oxide in which Ga is partly or entirely replaced with another metal element in the In—Ga—Zn-based metal oxide may be used.

The oxide semiconductor may include a crystal. For example, the oxide semiconductor may be polycrystalline or single crystal semiconductor. Alternatively, the oxide semiconductor may be amorphous.

As the aforementioned another metal element, a metal element that is capable of being bonded to more oxygen atoms than gallium can be used, for example, and specifically one or more elements of titanium, zirconium, hafnium, germanium, and tin can be used, for instance. Alternatively, as the aforementioned another metal element, one or more elements of lanthanum, cerium, praseodymium, neodymium, samarium, europium, gadolinium, terbium, dysprosium, holmium, erbium, thulium, ytterbium, and lutetium may be used. These metal elements function as a stabilizer. Note that the amount of such a metal element added is determined so that the metal oxide can function as a semiconductor. A metal element that can be bonded to more oxygen atoms than gallium is used and oxygen is supplied to the metal oxide, whereby oxygen vacancies in the metal oxide can be reduced.

Further, the semiconductor layer may have a layered structure including a first oxide semiconductor layer with an atomic ratio of In:Ga:Zn=1:1:1, a second oxide semiconductor layer with an atomic ratio of In:Ga:Zn=3:1:2, and a third oxide semiconductor layer with an atomic ratio of In:Ga:Zn=1:1:1. By employing this layered structure for the semiconductor layer, field effect mobility of the transistor can be increased, for example.

The leakage current of the transistors including the oxide semiconductor caused by thermal excitation is small owing to wide band gap. Further, the effective mass of a hole is as heavy as 10 or more, and the height of the tunnel barrier is as high as 2.8 eV or higher. Thus, the amount of tunnel current is small. Furthermore, the number of carriers in the semiconductor layer is very small; therefore, the off-state current can be made low. For example, the off-state current per micrometer of the channel width of the transistor at room temperature (25° C.) is lower than or equal to $1\times10^{-19}$ A (100 zA), preferably lower than or equal to $1\times10^{-22}$ A (100 yA). It is preferable that the off-state current of the transistor be as low as possible; the lower limit of the off-state current of the transistor is estimated to be approximately $1\times10^{-30}$ A/µm.

The semiconductor layer is not limited to the above-described oxide semiconductor layer and may be a semiconductor layer including a Group 14 element (e.g., silicon). For example, as the semiconductor layer including silicon, a single crystal silicon layer, a polycrystalline silicon layer, an amorphous silicon layer, or the like can be used.

The transistor including the oxide semiconductor can be fabricated in such a manner that, for example, impurities such as hydrogen and water are reduced as much as possible and oxygen vacancies are reduced as much as possible by supply of oxygen. At this time, the amount of hydrogen regarded as a donor impurity in the channel formation region is preferred to be lower than or equal to $1\times10^{19}/cm^3$, further preferably lower than or equal to $1\times10^{18}/cm^3$ by secondary ion mass spectrometry (SIMS).

By using the highly purified oxide semiconductor layer for the field-effect transistor, the carrier density of the oxide semiconductor layer can be lower than $1\times10^{14}/cm^3$, preferably lower than $1\times10^{12}/cm^3$, further preferably lower than $1\times10^{11}/cm^3$. Such a low carrier density can reduce the off-state current of the field-effect transistor per micrometer of channel width to $1\times10^{-19}$ A (100 zA) or less, preferably $1\times10^{-22}$ A (100 yA) or less. It is preferable that the off-state current of the field-effect transistor be as low as possible; the lower limit of the off-state current of the field-effect transistor is estimated to be approximately $1\times10^{-30}$ A/µm.

Next, a structure of an oxide semiconductor layer is described.

An oxide semiconductor layer is classified roughly into a non-single-crystal oxide semiconductor layer and a single crystal oxide semiconductor layer. The non-single-crystal oxide semiconductor layer includes any of a c-axis aligned crystalline oxide semiconductor (CAAC-OS) layer, a polycrystalline oxide semiconductor layer, a microcrystalline oxide semiconductor layer, an amorphous oxide semiconductor layer, and the like.

First, a CAAC-OS layer is described.

The CAAC-OS layer is one of oxide semiconductor layers including a plurality of c-axis aligned crystal parts.

In a transmission electron microscope (TEM) image of the CAAC-OS layer, a boundary between crystal parts, that is, a grain boundary is not clearly observed. Thus, in the CAAC-OS layer, a reduction in electron mobility due to the grain boundary is less likely to occur.

According to the TEM image of the CAAC-OS layer observed in a direction substantially parallel to a sample surface (cross-sectional TEM image), metal atoms are arranged in a layered manner in the crystal parts. Each metal atom layer has a morphology reflected by a surface over which the CAAC-OS layer is formed (hereinafter, a surface over which the CAAC-OS layer is formed is referred to as a formation surface) or a top surface of the CAAC-OS layer, and is arranged in parallel to the formation surface or the top surface of the CAAC-OS layer.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

In this specification, the trigonal and rhombohedral crystal systems are included in the hexagonal crystal system.

On the other hand, according to the TEM image of the CAAC-OS layer observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS layer.

Most of the crystal parts included in the CAAC-OS layer each fit inside a cube whose one side is less than 100 nm. Thus, there is a case where a crystal part included in the CAAC-OS layer fits a cube whose one side is less than 10 nm, less than 5 nm, or less than 3 nm. Note that when a plurality of crystal parts included in the CAAC-OS layer are connected to each other, one large crystal region is formed in some cases. For example, a crystal region with an area of 2500 nm² or more, 5 µm² or more, or 1000 µm² or more is observed in some cases in the plan TEM image.

A CAAC-OS layer is subjected to structural analysis with an X-ray diffraction (XRD) apparatus. For example, when the CAAC-OS layer including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS layer have c-axis alignment, and that the c-axes are aligned in a direction substantially perpendicular to the formation surface or the top surface of the CAAC-OS layer.

On the other hand, when the CAAC-OS layer is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor layer of InGaZnO$_4$, six peaks appear. The six peaks are derived from crystal planes equivalent to the (110) plane. On the other hand, in the case of a CAAC-OS layer, a peak is not clearly observed even when φ scan is performed with 2θ fixed at around 56°.

According to the above results, in the CAAC-OS layer having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS layer or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS layer is changed by etching or the like, the c-axis might not be necessarily parallel to a normal vector of a formation surface or a normal vector of a top surface of the CAAC-OS layer.

Further, distribution of c-axis aligned crystal parts in the CAAC-OS layer is not necessarily uniform. For example, in the case where crystal growth leading to the CAAC-OS layer occurs from the vicinity of the top surface of the layer, the proportion of the c-axis aligned crystal parts in the vicinity of the top surface is higher than that in the vicinity of the formation surface in some cases. Further, when an impurity is added to the CAAC-OS layer, a region to which the impurity is added is altered, and the proportion of the c-axis aligned crystal parts in the CAAC-OS layer varies depending on regions, in some cases.

Note that when the CAAC-OS layer with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS layer. It is preferable that in the CAAC-OS layer, a peak of 2θ appear at around 31° and a peak of 2θ do not appear at around 36°.

The CAAC-OS layer is an oxide semiconductor layer having a low impurity concentration. The impurity is any of elements which are not the main components of the oxide semiconductor layer and includes hydrogen, carbon, silicon, a transition metal element, and the like. In particular, an element (e.g., silicon) which has higher bonding strength with oxygen than a metal element included in the oxide semiconductor layer causes disorder of atomic arrangement in the oxide semiconductor layer because the element deprives the oxide semiconductor layer of oxygen, thereby reducing crystallinity. Further, a heavy metal such as iron or nickel, argon, carbon dioxide, and the like have a large atomic radius (or molecular radius); therefore, when any of such elements is contained in the oxide semiconductor layer, the element causes disorder of the atomic arrangement of the oxide semiconductor layer, thereby reducing crystallinity. Note that the impurity contained in the oxide semiconductor layer might become a carrier trap or a source of carriers.

The CAAC-OS layer is an oxide semiconductor layer having a low density of defect states. For example, oxygen vacancies in the oxide semiconductor layer serve as carrier traps or serve as carrier generation sources when hydrogen is captured therein.

The state in which impurity concentration is low and density of defect states is low (few oxygen vacancies) is referred to as "highly purified intrinsic" or "substantially highly purified intrinsic". A highly purified intrinsic or substantially highly purified intrinsic oxide semiconductor layer has few carrier generation sources, and thus has a low carrier density. Thus, a transistor using the oxide semiconductor layer rarely has a negative threshold voltage (rarely has normally-on characteristics). A highly purified intrinsic or substantially highly purified intrinsic oxide semiconductor layer has few carrier traps. Accordingly, the transistor using the oxide semiconductor layer has little variation in electrical characteristics and high reliability. Note that charges trapped by the carrier traps in the oxide semiconductor layer take a long time to be released and may behave like fixed charges. Thus, the transistor using the oxide semiconductor layer with a high impurity concentration and a high density of defect states has unstable electrical characteristics in some cases.

In a transistor using the CAAC-OS layer, change in electrical characteristics due to irradiation with visible light or ultraviolet light is small.

Next, a microcrystalline oxide semiconductor layer will be described.

In an image obtained with a TEM, for example, crystal parts cannot be found clearly in the microcrystalline oxide semiconductor layer in some cases. In most cases, the size of a crystal part included in the microcrystalline oxide semiconductor layer is greater than or equal to 1 nm and less than or equal to 100 nm, or greater than or equal to 1 nm and less than or equal to 10 nm, for example. A microcrystal with a size greater than or equal to 1 nm and less than or equal to 10 nm, or a size greater than or equal to 1 nm and less than or equal to 3 nm is specifically referred to as nanocrystal (nc). An oxide semiconductor layer including nanocrystal is referred to as an nc-OS (nanocrystalline oxide semiconductor) layer. In an image of the nc-OS layer obtained with a TEM, for example, a boundary between crystal parts is not clearly detected in some cases.

In the nc-OS layer, a microscopic region (for example, a region with a size greater than or equal to 1 nm and less than or equal to 10 nm, in particular, a region with a size greater than or equal to 1 nm and less than or equal to 3 nm) has a periodic atomic order. However, there is no regularity of crystal orientation between different crystal parts in the nc-OS layer; thus, the orientation of the whole layer is not observed. Accordingly, in some cases, the nc-OS layer cannot be distinguished from an amorphous oxide semiconductor layer depending on an analysis method. For example, when the nc-OS layer is subjected to structural analysis by an out-of-plane method with an XRD apparatus using an X-ray having a diameter larger than that of a crystal part, a peak which shows a crystal plane does not appear. Further, a halo pattern is shown in an electron diffraction pattern (also referred to as a selected-area electron diffraction pattern) of the nc-OS layer obtained by using an electron beam having a probe diameter (e.g., larger than or equal to 50 nm) larger than a diameter of a crystal part. Meanwhile, spots are shown in a nanobeam electron diffraction pattern of the nc-OS layer obtained by using an electron beam having a probe diameter (e.g., larger than or equal to 1 nm and smaller than or equal to 30 nm) close to, or smaller than or equal to a diameter of a crystal part. Further, in a nanobeam electron diffraction pattern of the nc-OS layer, regions with high luminance in a circular (ring) pattern are shown in some cases. Also in a nanobeam electron diffraction pattern of the nc-OS layer, a plurality of spots are shown in a ring-like region in some cases.

Since the nc-OS layer is an oxide semiconductor layer having more regularity than the amorphous oxide semiconductor layer, the nc-OS layer has a lower density of defect states than the amorphous oxide semiconductor layer. However, there is no regularity of crystal orientation between different crystal parts in the nc-OS layer; hence, the nc-OS layer has a higher density of defect states than the CAAC-OS layer.

Note that an oxide semiconductor layer may be a stacked film including two or more layers of an amorphous oxide semiconductor layer, a microcrystalline oxide semiconductor layer, and a CAAC-OS layer, for example.

For example, the oxide semiconductor layer that is a CAAC-OS can be formed by a sputtering method. In this case, the sputtering is performed using a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the sputtered particle reaches a substrate while maintaining their crystal state, whereby a crystal state of the sputtering target is transferred to a substrate. In this manner, the CAAC-OS is formed.

For the deposition of the CAAC-OS, the following conditions are preferably used.

For example, the CAAC-OS is formed while the impurity concentration is reduced, whereby the crystal state of the oxide semiconductor can be prevented from being broken by the impurities. For example, the concentration of impurities (e.g., hydrogen, water, carbon dioxide, or nitrogen) existing in a deposition chamber is preferably reduced. Further, the concentration of impurities in a deposition gas is preferably reduced. For example, a deposition gas whose dew point is −80° C. or lower, preferably −100° C. or lower is preferably used as a deposition gas.

It is preferable that the temperature of the substrate at the time of deposition be high. In the case of high temperature substrate, when the flat-plate-like sputtered particle reaches the substrate, migration of the sputtered particle occurs, so that a flat plane of the sputtered particle is attached to the substrate. For example, an oxide semiconductor film is deposited at a substrate heating temperature higher than or equal to 100° C. and lower than or equal to 740° C., preferably higher than or equal to 200° C. and lower than or equal to 500° C.

Further, it is preferable to suppress plasma damage at the time of deposition by increasing the oxygen percentage in the deposition gas and optimizing electric power. For example, the oxygen percentage in the deposition gas is preferably 30 vol % or higher, still preferably 100 vol %.

A source electrode layer and a drain electrode layer can be formed using a metal film containing an element selected from Al, Cr, Cu, Ta, Ti, Mo, and W, a metal nitride film containing any of these elements (e.g., a titanium nitride film, a molybdenum nitride film, or a tungsten nitride film), or the like. Alternatively, a film of a high-melting-point metal such as Ti, Mo, or W or a metal nitride film thereof (e.g., a titanium nitride film, a molybdenum nitride film, or a tungsten nitride film) may be formed over or/and below a metal film such as an Al film or a Cu film. Further alternatively, the source electrode layer and the drain electrode layer may be formed using a conductive metal oxide. As the conductive metal oxide, indium oxide ($In_2O_3$ or the like), tin oxide ($SnO_2$ or the like), zinc oxide (ZnO), indium tin oxide (ITO), indium oxide-zinc oxide ($In_2O_3$—ZnO or the like), or any of these metal oxide materials in which silicon oxide is contained can be used.

As the insulating layer 116, an insulating film with a planarization function is preferably selected in order to reduce surface unevenness due to the transistor. For example, an organic material such as a polyimide resin, an acrylic resin, or a benzocyclobutene-based resin can be used. Besides the above organic materials, a low-dielectric constant material (a low-k material) or the like can be used. Note that the insulating layer 116 may be formed by stacking a plurality of insulating films formed using any of these materials.

In each of the transistors 152 and 153, an electrode layer is provided over the insulating layer 116. The electrode layer functions as a back gate electrode layer. For example, in the case of an n-channel transistor, a voltage between the back gate and the source may be a negative voltage. Accordingly, the threshold voltage of the transistor can be shifted in the positive direction. The potential of the back gate may be constant (for example, 0 V). By providing the back gate electrode layer in the transistor in the driver circuit portion and controlling the potential of the back gate electrode layer, the threshold voltage of the transistor can be controlled. The back gate electrode layer may be provided over the semiconductor layer with the insulating layer 114 therebetween.

The insulating layer 124 is formed so as to cover an end portion of the first electrode 118. The insulating layer 124 preferably has a curved surface with curvature at an upper end portion or a lower end portion thereof in order to obtain favorable coverage with the second electrode 122 which is to be formed over the insulating layer 124. For example, it is preferable that the upper end portion or the lower end portion of the insulating layer 124 have a curved surface with a radius of curvature (0.2 μm to 3 μm). The insulating layer 124 can be formed using an organic compound such as a negative photosensitive resin or a positive photosensitive resin, or an inorganic compound such as silicon oxide or silicon oxynitride. Note that the insulating layer 124 in the driver circuit portion may be removed.

The light-emitting element 130 includes the first electrode 118, the EL layer 120, and the second electrode 122. The first electrode 118 is provided on the side opposite to a side where light is extracted and is formed using a reflective material. As the reflective material, a metal material such as aluminum, gold, platinum, silver, nickel, tungsten, chromium, molybdenum, iron, cobalt, copper, or palladium can be used. The metal material or an alloy containing the metal material may contain lanthanum, neodymium, or germanium. Any of the following can also be used: an alloy containing aluminum (aluminum alloy) such as an alloy of aluminum and titanium, an alloy of aluminum and nickel, or an alloy of aluminum and neodymium; and an alloy containing silver such as an alloy of silver and copper. An alloy of silver and copper is preferable because of its high heat resistance.

The EL layer 120 includes at least a layer containing a light-emitting substance (light-emitting layer). In addition, the EL layer 120 can have a layered structure in which a layer containing a substance with a high electron-transport property, a layer containing a substance with a high hole-transport property, a layer containing a substance with a high electron-injection property, a layer containing a substance with a high hole-injection property, a layer containing a bipolar substance (a substance having a high electron-transport property and a high hole-transport property), and the like are combined as appropriate. Structural examples of the EL layer will be described in detail in Embodiment 3.

As a light-transmitting material for the second electrode 122, indium oxide, ITO, indium oxide-zinc oxide, zinc oxide, zinc oxide to which gallium is added, or the like can be used.

For the second electrode 122, a metal material such as gold, platinum, nickel, tungsten, chromium, molybdenum, iron, cobalt, copper, palladium, or titanium can also be used. A nitride of the metal material (e.g., titanium nitride) or the like may also be used. Graphene or the like may also be used. In the case of using the metal material (or the nitride thereof), the second electrode 122 may be thinned so as to be able to transmit light.

On the second substrate 204, a color filter 166 is provided so as to overlap with the light-emitting element 130. The color filter 166 is provided to control the color of light emitted from the light-emitting element 130. For example, in a full-color display device using white light-emitting elements, a plurality of light-emitting units provided with color filters of different colors are used. In that case, three colors, red (R), green (G), and blue (B), may be used, or four colors, red (R), green (G), blue (B), and yellow (Y), may be used.

A black matrix 164 is provided between the adjacent color filters 166. The black matrix 164 shields a light-emitting unit from light emitted from the light-emitting elements 130 in adjacent light-emitting units and prevents color mixture between the adjacent light-emitting units. Here, the color filter 166 is provided so that its end portions overlap with the black matrix 164, whereby light leakage can be reduced. The black matrix 164 can be formed using a material that shields light emitted from the light-emitting element 130, for example, a metal or an organic resin. Note that the black matrix 164 may be provided in a region other than the pixel portion 202, for example, in the scan line driver circuit portion 203a or 203b.

An overcoat 168 is formed to cover the color filter 166 and the black matrix 164. The overcoat 168 is formed using a material that transmits light emitted from the light-emitting element 130, and can be an inorganic insulating film or an organic insulating film, for example. Note that the overcoat 168 is not necessarily provided unless needed.

As illustrated in FIGS. 6A and 6B, in addition to the first sealant 205 with which the first substrate 201 and the second substrate 204 are attached to each other, the second sealants 206a and 206b which are in contact with at least one of the side surface of the first substrate 201 and the side surface of the second substrate 204 and with which the gap between the first substrate 201 and the second substrate 204 is filled are provided. At least one of the first sealant 205, the second sealant 206a, and the second sealant 206b preferably has low moisture permeability. Further, the second sealants 206a and 206b preferably have lower moisture permeability than the first sealant 205. With the use of a material having low moisture permeability for at least one of the first sealant 205, the second sealant 206a, and the second sealant 206b, entry of a substance (e.g., water) serving as an impurity for the display element or the transistor through the first sealant 205 and the second sealant 206 can be prevented.

With such a structure, an impurity such as water can be prevented from entering the light-emitting element 130. Accordingly, an organic compound or a metal material included in the light-emitting element 130 can be prevented from being degraded through a reaction with an impurity such as water. Further, entry of water into the oxide semiconductor layer in the transistors 140a, 140b, 152, and 153 can be prevented. As a result, variation in electric characteristics of the transistors including the oxide semiconductor layer can be suppressed. Accordingly, the reliability of the display device can be improved.

By providing the second sealant 206 in contact with at least one of the side surface of the first substrate 201 and the side surface of the second substrate 204 so that the gap between the first substrate 201 and the second substrate 204 is filled, the frame can be made narrow as compared to the case where the first sealant 205 and the second sealant 206 are provided between the first substrate 201 and the second substrate 204.

This embodiment can be combined with any of the other embodiments as appropriate.

Embodiment 4

In this embodiment, structural examples of an EL layer that can be used for a light-emitting display device of one embodiment of the present invention will be described with reference to FIGS. 7A to 7C.

A known substance can be used for the EL layer, and either a low molecular compound or a high molecular compound can be used. Note that the substance for forming the EL layer includes not only an organic compound but also an inorganic compound in part thereof.

Figure 7A:
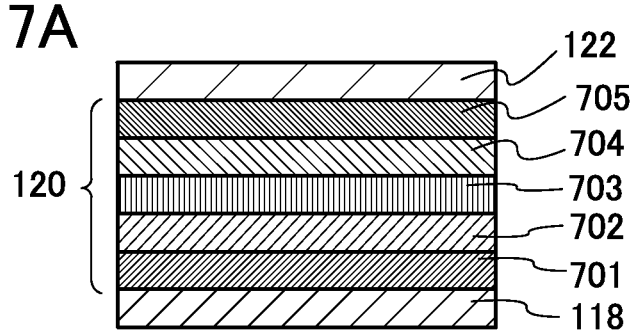
FIGS. 7A to 7C each illustrate an EL layer.

In FIG. 7A, the EL layer 120 is provided between the first electrode 118 and the second electrode 122. In the EL layer 120 in FIG. 7A, a hole-injection layer 701, a hole-transport layer 702, a light-emitting layer 703, an electron-transport layer 704, and an electron-injection layer 705 are stacked in that order from the first electrode 118 side.

Figure 7B:
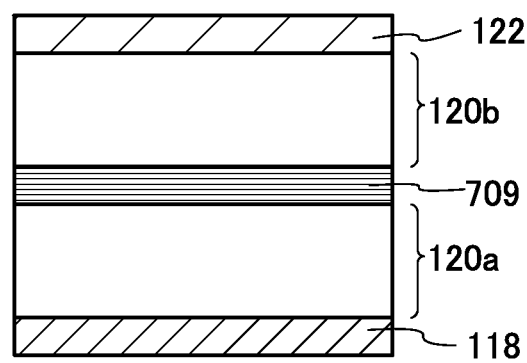

A plurality of EL layers may be stacked between the first electrode 118 and the second electrode 122 as illustrated in FIG. 7B. In that case, a charge generation layer 709 is preferably provided between a first EL layer 120a and a second EL layer 120b which are stacked. A light-emitting element having such a structure is unlikely to suffer the problem of energy transfer, quenching, or the like and gives wider choice of materials, thereby easily having both high light emission efficiency and a long lifetime. Moreover, it is easy to obtain phosphorescence from one EL layer and fluorescence from the other EL layer. This structure can be combined with the above-mentioned structure of the EL layer.

Furthermore, by making emission colors of EL layers different, light of a desired color can be obtained from the light-emitting element as a whole. For example, the emission colors of first and second EL layers are complementary in a light-emitting element having the two EL layers, so that the light-emitting element can be made to emit white light as a whole. Note that the term "complementary" means color relationship in which an achromatic color is obtained when colors are mixed. That is, emission of white light can be obtained by mixture of light emitted from substances whose emission colors are complementary colors. Further, the same applies to a light-emitting element having three or more EL layers.

Figure 7C:
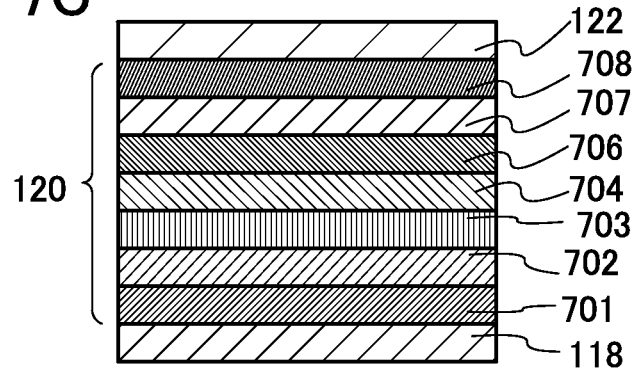

As illustrated in FIG. 7C, the EL layer 120 may include the hole-injection layer 701, the hole-transport layer 702, the light-emitting layer 703, the electron-transport layer 704, an electron-injection layer 706, an electron-relay layer 707, and a composite material layer 708 which is in contact with the second electrode 122, between the first electrode 118 and the second electrode 122.

It is preferable to provide the composite material layer 708 which is in contact with the second electrode 122 because damage caused to the EL layer 120 particularly when the second electrode 122 is formed by a sputtering method can be reduced.

By providing the electron-injection buffer layer 706, an injection barrier between the composite material layer 708 and the electron-transport layer 704 can be reduced; thus, electrons generated in the composite material layer 708 can be easily injected to the electron-transport layer 704.

The electron-relay layer 707 is preferably formed between the electron-injection buffer layer 706 and the composite material layer 708. The electron-relay layer 707 is not necessarily provided; however, by providing the electron-relay layer 707 having a high electron-transport property, electrons can be rapidly transported to the electron-injection buffer layer 706.

In the structure in which the electron-relay layer 707 is provided between the composite material layer 708 and the electron-injection buffer layer 706, the acceptor substance contained in the composite material layer 708 and the donor substance contained in the electron-injection buffer layer 706 are less likely to interact with each other, and thus their functions hardly interfere with each other. Accordingly, an increase in driving voltage can be suppressed.

Examples of materials that can be used for each layer will be described below. Note that each layer is not limited to a single layer, and may be a stack of two or more layers.

The hole-injection layer 701 is a layer containing a substance having a high hole-injection property. As the substance having a high hole-injection property, for example, a metal oxide such as molybdenum oxide, titanium oxide, vanadium oxide, rhenium oxide, ruthenium oxide, chromium oxide, zirconium oxide, hafnium oxide, tantalum oxide, silver oxide, tungsten oxide, or manganese oxide; or a phthalocyanine-based compound such as copper(II) phthalocyanine (abbreviation: CuPc) can be used.

The following aromatic amine compounds which are low molecular organic compounds can be used: 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), and 3-[N-(1-naphthyl)-N-(9-phenylcarbazol-3-yl)amino]-9-phenylcarbazole (abbreviation: PCzPCN1).

Alternatively, high molecular compounds can be used. As examples of the high molecular compound, the following are given: poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), and poly[N,N'-bis(4-butylphenyl)-N,N'-bis(phenyl)benzidine] (abbreviation: Poly-TPD). A high molecular compound to which acid is added, such as poly(3,4-ethylenedioxythiophene)/poly(styrenesulfonic acid) (PEDOT/PSS), or polyaniline/poly(styrenesulfonic acid) (PAni/PSS), can also be used.

In particular, for the hole-injection layer 701, a composite material in which an acceptor substance is added to an organic compound having a high hole-transport property is preferably used. With the use of the composite material in which an acceptor substance is added to a substance having a high hole-transport property, excellent hole injection from the first electrode 118 can be obtained, which results in a reduction in driving voltage of the light-emitting element. Such a composite material can be formed by co-depositing a substance having a high hole-transport property and an acceptor substance. The hole-injection layer 701 is formed using the composite material, whereby excellent hole injection from the first electrode 118 into the EL layer 120 can be obtained.

The organic compound for the composite material is preferably a substance having a hole mobility of $10^{-6}$ cm$^2$/Vs or higher. Note that any other substances may also be used as long as the hole-transport property thereof is higher than the electron-transport property thereof. The organic compounds that can be used for the composite material will be specifically given below.

Examples of the organic compounds that can be used for the composite material include aromatic amine compounds such as TDATA, MTDATA, DPAB, DNTPD, DPA3B, PCzPCA1, PCzPCA2, PCzPCN1, 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), and 4-phenyl-4'-(9-phenylfluoren-9-yl)triphenylamine (abbreviation: BPAFLP); and carbazole derivatives such as 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 9-phenyl-3-[4-(10-phenyl-9-anthryl)phenyl]-9H-carbazole (abbreviation: PCzPA), and 1,4-bis[4-(N-carbazolyl)phenyl]-2,3,5,6-tetraphenylbenzene.

Alternatively, any of the following aromatic hydrocarbon compounds can be used: 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 9,10-bis[2-(1-naphthyl)phenyl]-2-tert-butylanthracene, 9,10-bis[2-(1-naphthyl)phenyl]anthracene, 2,3,6,7-tetramethyl-9,10-di(1-naphthyl)anthracene, and the like.

Further alternatively, any of the following aromatic hydrocarbon compounds can be used: 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, coronene, 4,4'-bis(2,2-diphenylvinyl)biphenyl (abbreviation: DPVBi), 9,10-bis[4-(2,2-diphenylvinyl)phenyl]anthracene (abbreviation: DPVPA), and the like.

A high molecular compound such as PVK, PVTPA, PTPDMA, or Poly-TPD can also be used.

As examples of the electron acceptor, organic compounds such as 7,7,8,8-tetracyano-2,3,5,6-tetrafluoroquinodimethane (abbreviation: F$_4$-TCNQ) and chloranil, and transition metal oxides can be given. Oxides of metals belonging to Groups 4 to 8 in the periodic table can be also given. Specifically, vanadium oxide, niobium oxide, tantalum oxide, chromium oxide, molybdenum oxide, tungsten oxide, manganese oxide, and rhenium oxide are preferable because of their high electron-accepting property. Among these, molybdenum oxide is particularly preferable because it is stable in the air, has a low hygroscopic property, and is easily handled.

The hole-transport layer 702 is a layer containing a substance having a high hole-transport property. As the substance having a high hole-transport property, any of the following aromatic amine compounds can be used, for example: NPB, TPD, BPAFLP, 4,4'-bis[N-(9,9-dimethylfluoren-2-yl)-N-phenylamino]biphenyl (abbreviation: DFLDPBi), and 4,4'-bis[N-(spiro-9,9'-bifluoren-2-yl)-N-phenylamino]biphenyl (abbreviation: BSPB). The substances given here are mainly ones that have a hole mobility of $10^{-6}$ cm$^2$/Vs or higher. Note that any other substances may also be used as long as the hole-transport property thereof is higher than the electron-transport property thereof.

For the hole-transport layer 702, a carbazole derivative such as CBP, CzPA, or PCzPA; an anthracene derivative such as t-BuDNA, DNA, or DPAnth; or a high molecular compound such as PVK, PVTPA, PTPDMA, or Poly-TPD can also be used.

As the light-emitting layer 703, for example, a fluorescent compound which exhibits fluorescence or a phosphorescent compound which exhibits phosphorescence can be used.

As the fluorescent compound that can be used for the light-emitting layer 703, a material for blue light emission, a material for green light emission, a material for yellow light emission, and a material for red light emission are given. As examples of the material for blue light emission, the following are given: N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(10-phenyl-9-anthryl)-4'-(9-phenyl-9H-carbazol-3-yl)triphenylamine (abbreviation: PCBAPA), and the like. As examples of the material for green light emission, the following are given: N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), N-[9,10-bis(1,1'-biphenyl-2-yl)]-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), and the like. As examples of the material for yellow light emission, rubrene, 5,12-bis(1,1'-biphenyl-4-yl)-6,11-diphenyltetracene (abbreviation: BPT), and the like are given. As examples of the material for red light emission, N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), and the like are given.

As the phosphorescent compound that can be used for the light-emitting layer 703, a material for blue light emission, a material for green light emission, a material for yellow light emission, a material for orange light emission, and a material for red light emission are given. As examples of the material for blue light emission, the following are given: bis[2-(4',6'-difluorophenyl)pyridinato-N,C$^{2'}$]iridium(III)tetrakis(1-pyrazolyl)borate (abbreviation: FIr6), bis[2-(4',6'-difluorophenyl)pyridinato-N,C$^{2'}$]iridium(III)picolinate (abbreviation: FIrpic), bis{2-[3',5'-bis(trifluoromethyl)phenyl]pyridinato-N,C$^{2'}$}iridium(III) picolinate (abbreviation: Ir(CF$_3$ ppy)$_2$(pic)), bis[2-(4',6'-difluorophenyl)pyridinato-N,C$^{2'}$]iridium(III)acetylacetonate (abbreviation: FIr(acac)), and the like. As examples of the material for green light emission, the following are given: tris(2-phenylpyridinato-N,C$^{2'}$)iridium(III) (abbreviation: Ir(ppy)$_3$), bis[2-phenylpyridinato-N,C$^{2'}$]iridium(III)acetylacetonate (abbreviation: Ir(ppy)$_2$(acac)), bis(1,2-diphenyl-1H-benzimidazolato)iridium(III)acetylacetonate (abbreviation: Ir(pbi)$_2$(acac)), bis(benzo[h]quinolinato)iridium(III)acetylacetonate (abbreviation: Ir(bzq)$_2$(acac)), tris(benzo[h]quinolinato)iridium(III) (abbreviation: Ir(bzq)$_3$), and the like. As examples of the material for yellow light emission, the following are given: bis(2,4-diphenyl-1,3-oxazolato-N,C$^{2'}$)iridium(III)acetylacetonate (abbreviation: Ir(dpo)$_2$(acac)), bis[2-(4'-perfluorophenylphenyl)pyridinato]iridium(III)acetylacetonate (abbreviation: Ir(p-PF-ph)$_2$(acac)), bis(2-phenylbenzothiazolato-N,C$^{2'}$)iridium(III)acetylacetonate (abbreviation: Ir(bt)$_2$(acac)), (acetylacetonato)bis[2,3-bis(4-fluorophenyl)-5-methylpyrazinato]iridium(III) (abbreviation: Ir(Fdppr-Me)$_2$(acac)), (acetylacetonato)bis[2-(4-methoxyphenyl)-3,5-dimethylpyrazinato]iridium(III) (abbreviation: Ir(dmmoppr)$_2$(acac)), and the like. As examples of the material for orange light emission, the following are given: tris(2-phenylquinolinato-N,C$^{2'}$)iridium (III) (abbreviation: Ir(pq)$_3$), bis(2-phenylquinolinato-N,C$^{2'}$)iridium(III)acetylacetonate (abbreviation: Ir(pq)$_2$(acac)), (acetylacetonato)bis(3,5-dimethyl-2-phenylpyrazinato)iridium(III) (abbreviation: Ir(mppr-Me)$_2$(acac)), (acetylacetonato)bis(5-isopropyl-3-methyl-2-phenylpyrazinato)iridium (III) (abbreviation: Ir(mppr-iPr)$_2$(acac)), and the like. As examples of the material for red light emission, the following organometallic complexes are given: bis[2-(2'-benzo[4,5-a]thienyl)pyridinato-N,C$^{3'}$)iridium(III)acetylacetonate (abbreviation: Ir(btp)$_2$(acac)), bis(1-phenylisoquinolinato-N,C$^{2'}$)iridium(III)acetylacetonate (abbreviation: Ir(piq)$_2$(acac)), (acetylacetonato)bis[2,3-bis(4-fluorophenyl)quinoxalinato]iridium(III) (abbreviation: Ir(Fdpq)$_2$(acac)), (acetylacetonato)bis(2,3,5-triphenylpyrazinato)iridium(III) (abbreviation: Ir(tppr)$_2$(acac)), (dipivaloylmethanato)bis(2,3,5-triphenylpyrazinato)iridium(III) (abbreviation: Ir(tppr)$_2$ (dpm)), and (2,3,7,8,12,13,17,18-octaethyl-21H,23H-porphyrin)platinum(II) (abbreviation: PtOEP). In addition, rare earth metal complexes, such as tris(acetylacetonato)(monophenanthroline)terbium(III) (abbreviation: Tb(acac)$_3$(Phen)), tris(1,3-diphenyl-1,3-propanedionato)(monophenanthroline)europium(III) (abbreviation: Eu(DBM)$_3$(Phen)), and tris[1-(2-thenoyl)-3,3,3-trifluoroacetonato](monophenanthroline)europium(III) (abbreviation: Eu(TTA)$_3$(Phen)), exhibit light emission from rare earth metal ions (electron transition between different multiplicities), and thus can be used as phosphorescent compounds.

Note that the light-emitting layer 703 may have a structure in which any of the above-described light-emitting organic compounds (a light-emitting substance or a guest material) is dispersed in another substance (a host material). As the host material, a variety of kinds of materials can be used, and it is preferable to use a substance which has a lowest unoccupied molecular orbital level (LUMO level) higher than that of the guest material and has a highest occupied molecular orbital level (HOMO level) lower than that of the guest material.

As specific examples of the host material, the following are given: metal complexes such as tris(8-quinolinolato)aluminum(III) (abbreviation: Alq), tris(4-methyl-8-quinolinolato)aluminum(III) (abbreviation: Almq$_3$), bis(10-hydroxybenzo

[h]quinolinato)beryllium(II) (abbreviation: BeBq$_2$), bis(2-methyl-8-quinolinolato) (4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato] zinc(II) (abbreviation: ZnBTZ); heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2"-(1,3,5-benzenetriyl)tris(1-phenyl-1H-benzimidazole) (abbreviation: TPBI), bathophenanthroline (abbreviation: BPhen), and bathocuproine (abbreviation: BCP); condensed aromatic compounds such as 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 3,3',3"-(benzene-1,3,5-triyl)tripyrene (abbreviation: TPB3), 9,10-diphenylanthracene (abbreviation: DPAnth), and 6,12-dimethoxy-5,11-diphenylchrysene; aromatic amine compounds such as N,N-dipheyl-9-[4-(10-phenyl-9-anthryl)phenyl]-9H-carbazol-3-amine (abbreviation: CzAlPA), 4-(10-phenyl-9-anthryl)triphenylamine (abbreviation: DPhPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), NPB (or α-NPD), TPD, DFLDPBi, and BSPB; and the like.

Plural kinds of materials can be used as the host material. For example, in order to suppress crystallization, a substance such as rubrene which suppresses crystallization may be further added. In addition, NPB, Alq, or the like may be further added in order to efficiently transfer energy to the guest material.

When the structure in which a guest material is dispersed in a host material is employed, crystallization of the light-emitting layer 703 can be suppressed. In addition, concentration quenching due to high concentration of the guest material can be suppressed.

For the light-emitting 703, a high molecular compound can be used. Specifically, a material for blue light emission, a material for green light emission, and a material for orange to red light emission are given. As examples of the material for blue light emission, the following are given: poly(9,9-dioctylfluorene-2,7-diyl) (abbreviation: PFO), poly[(9,9-dioctylfluorene-2,7-diyl-co-(2,5-dimethoxybenzene-1,4-diyl)] (abbreviation: PF-DMOP), poly{(9,9-dioctylfluorene-2,7-diyl)-co-[N,N'-di-(p-butylphenyl)-1,4-diaminobenzene]} (abbreviation: TAB-PFH), and the like. As examples of the material for green light emission, the following are given: poly(p-phenylenevinylene) (abbreviation: PPV), poly[(9,9-dihexylfluorene-2,7-diyl)-alt-co-(benzo[2,1,3]thiadiazole-4,7-diyl)] (abbreviation: PFBT), poly[(9,9-dioctyl-2,7-divinylenfluorenylene)-alt-co-(2-methoxy-5-(2-ethylhexyloxy)-1,4-phenylene)], and the like. As examples of the material for orange to red light emission, the following are given: poly[2-methoxy-5-(T-ethylhexoxy)-1,4-phenylenevinylene](abbreviation: MEH-PPV), poly(3-butylthiophene-2,5-diyl) (abbreviation: R4-PAT), poly{[9,9-dihexyl-2,7-bis(1-cyanovinylene)fluorenylene]-alt-co-[2,5-bis(N,N'-diphenylamino)-1,4-phenylene]}, poly{[2-methoxy-5-(2-ethylhexyloxy)-1,4-bis(1-cyanovinylenephenylene)]-alt-co-[2,5-bis(N,N'-diphenylamino)-1,4-phenylene]} (abbreviation: CN-PPV-DPD), and the like.

Further, by providing a plurality of light-emitting layers and making emission colors of the layers different, light emission having a desired color can be obtained from the light-emitting element as a whole. For example, in a light-emitting element having two light-emitting layers, the emission colors of first and second light-emitting layers are complementary, so that the light-emitting element can be made to emit white light as a whole. This can be applied to a light-emitting element having three or more light-emitting layers.

The electron-transport layer 704 is a layer containing a substance having a high electron-transport property. As examples of the substance having a high electron-transport property, metal complexes having a quinoline skeleton or a benzoquinoline skeleton, such as Alq, Almq$_3$, BeBq$_2$, and BAlq, are given. A metal complex or the like including an oxazole-based or thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$) can also be used. Besides the metal complexes, PBD, OXD-7, TAZ, BPhen, BCP, or the like can also be used. The substances given here are mainly ones that have an electron mobility of $10^{-6}$ cm$^2$/Vs or higher.

The electron-injection layer 705 is a layer containing a substance having a high electron-injection property. For the electron-injection layer 705, an alkali metal, an alkaline earth metal, or a compound thereof, such as lithium, cesium, calcium, lithium fluoride, cesium fluoride, calcium fluoride, or lithium oxide, can be used. A rare earth metal compound such as erbium fluoride can also be used. Any of the above substances for forming the electron-transport layer 704 can also be used.

Note that the hole-injection layer 701, the hole-transport layer 702, the light-emitting layer 703, the electron-transport layer 704, and the electron-injection layer 705 which are described above can each be formed by a method such as an evaporation method (e.g., a vacuum evaporation method), an inkjet method, or a coating method.

The charge generation layer 709 illustrated in FIG. 7B can be formed using the above-mentioned composite material. Further, the charge generation layer 709 may have a layered structure including a layer containing the composite material and a layer containing another material. In that case, as the layer containing another material, a layer containing an electron donating substance and a substance having a high electron-transport property, a layer formed of a transparent conductive film, or the like can be used.

The composite material layer 708 illustrated in FIG. 7C can be formed using the above composite material in which an acceptor substance is contained in an organic compound having a high hole-transport property.

A substance having a high electron-injection property can be used for the electron-injection buffer layer 706: for example, an alkali metal, an alkaline earth metal, a rare earth metal, or a compound of the above metal (e.g., an oxide such as lithium oxide, a halide, or a carbonate such as lithium carbonate or cesium carbonate) can be used.

Further, in the case where the electron-injection buffer layer 706 contains a substance having a high electron-transport property and a donor substance, the donor substance is preferably added so that the mass ratio of the donor substance to the substance having a high electron-transport property is from 0.001:1 to 0.1:1. Note that as the donor substance, an organic compound such as tetrathianaphthacene (abbreviation: TTN), nickelocene, or decamethylnickelocene can be used as well as an alkali metal, an alkaline earth metal, a rare earth metal, and a compound of the above metal (e.g., an oxide such as lithium oxide, a halide, and a carbonate such as lithium carbonate or cesium carbonate). Note that as the substance having a high electron-transport property, a material similar to the material for the electron-transport layer 704 described above can be used.

The electron-relay layer 707 contains a substance having a high electron-transport property and is formed so that the LUMO level of the substance having a high electron-transport property is located between the LUMO level of the acceptor substance contained in the composite material layer 708 and the LUMO level of the substance having a high electron-transport property contained in the electron-transport layer 704. In the case where the electron-relay layer 707 contains a donor substance, the donor level of the donor substance is controlled so as to be located between the LUMO level of the acceptor substance contained in the composite material layer 708 and the LUMO level of the substance having a high electron-transport property contained in the electron-transport layer 704. As a specific value of the energy level, the LUMO level of the substance having a high electron-transport property contained in the electron-relay layer 707 is preferably greater than or equal to $-5.0$ eV, more preferably greater than or equal to $-5.0$ eV and less than or equal to $-3.0$ eV.

As the substance having a high electron-transport property contained in the electron-relay layer 707, a phthalocyanine-based material or a metal complex having a metal-oxygen bond and an aromatic ligand is preferably used.

As the phthalocyanine-based material contained in the electron-relay layer 707, specifically, any of CuPc, phthalocyanine tin(II) complex (SnPc), phthalocyanine zinc complex (ZnPc), cobalt(II) phthalocyanine, β-form (CoPc), phthalocyanine iron (FePc), and vanadyl 2,9,16,23-tetraphenoxy-29H,31H-phthalocyanine (PhO-VOPc) is preferably used.

As the metal complex having a metal-oxygen bond and an aromatic ligand, which is contained in the electron-relay layer 707, a metal complex having a metal-oxygen double bond is preferably used. The metal-oxygen double bond has an acceptor property (a property of easily accepting electrons); thus, electrons can be transferred (donated and accepted) more easily.

As a metal complex having a metal-oxygen bond and an aromatic ligand, a phthalocyanine-based material is preferable. Specifically, vanadyl phthalocyanine (VOPc), a phthalocyanine tin(IV) oxide complex (SnOPc), or a phthalocyanine titanium oxide complex (TiOPc) is preferable because a metal-oxygen double bond is more likely to act on another molecular in terms of a molecular structure and an acceptor property is high.

Note that as the phthalocyanine-based materials described above, a phthalocyanine-based material having a phenoxy group is preferable. Specifically, a phthalocyanine derivative having a phenoxy group, such as PhO-VOPc, is preferable. A phthalocyanine derivative having a phenoxy group is soluble in a solvent, and thus has an advantage of being easily handled during formation of a light-emitting element and an advantage of facilitating maintenance of an apparatus used for film formation.

The electron-relay layer 707 may further contain a donor substance. As the donor substance, any of the following can be used: an organic compound such as TTN, nickelocene, or decamethylnickelocene, in addition to an alkali metal, an alkaline earth metal, a rare earth metal, and a compound of the above metals (e.g., an oxide such as lithium oxide, a halide, and a carbonate such as lithium carbonate or cesium carbonate). When such a donor substance is contained in the electron-relay layer 707, electrons can be transferred easily and the light-emitting element can be driven at lower voltage.

In the case where a donor substance is contained in the electron-relay layer 707, in addition to the materials described above as the substance having a high electron-transport property, a substance having a LUMO level greater than the acceptor level of the acceptor substance contained in the composite material layer 708 can be used. As a specific value of the energy level, the LUMO level is greater than or equal to $-5.0$ eV, preferably greater than or equal to $-5.0$ eV and less than or equal to $-3.0$ eV. As examples of such a substance, a perylene derivative, a nitrogen-containing condensed aromatic compound, and the like are given. Note that a nitrogen-containing condensed aromatic compound is preferably used for the electron-relay layer 707 because of its stability.

As specific examples of the perylene derivative, the following are given: 3,4,9,10-perylenetetracarboxylicdianhydride (abbreviation: PTCDA), 3,4,9,10-perylenetetracarboxylic-bis-benzimidazole (abbreviation: PTCBI), N,N'-dioctyl-3,4,9,10-perylenetetracarboxylic diimide (abbreviation: PTCDI-C8H), N,N'-dihexyl-3,4,9,10-perylenetetracarboxylic diimide (Hex PTC), and the like.

As specific examples of the nitrogen-containing condensed aromatic compound, the following are given: pirazino[2,3-f][1,10]phenanthroline-2,3-dicarbonitrile (abbreviation: PPDN), 2,3,6,7,10,11-hexacyano-1,4,5,8,9,12-hexaazatriphenylene (abbreviation: HAT(CN)$_6$), 2,3-diphenylpyrido[2,3-b]pyrazine (abbreviation: 2PYPR), 2,3-bis(4-fluorophenyl)pyrido[2,3-b]pyrazine (abbreviation: F2PYPR), and the like.

Besides, 7,7,8,8-tetracyanoquinodimethane (abbreviation: TCNQ), 1,4,5,8-naphthalenetetracarboxylicdianhydride (abbreviation: NTCDA), perfluoropentacene, copper hexadecafluorophthalocyanine (abbreviation: F$_{16}$CuPc), N,N'-bis(2,2,3,3,4,4,5,5,6,6,7,7,8,8-pentadecafluorooctyl)-1,4,5,8-naphthalenetetracarboxylic diimide (abbreviation: NTCDI-C8F), 3',4'-dibutyl-5,5''-bis(dicyanomethylene)-5,5''-dihydro-2,2':5',2''-terthiophene (abbreviation: DCMT), methanofullerenes (e.g., [6,6]-phenyl C$_{61}$ butyric acid methyl ester), or the like can be used.

Note that in the case where a donor substance is contained in the electron-relay layer 707, the electron-relay layer 707 may be formed by a method such as co-evaporation of the substance having a high electron-transport property and the donor substance.

In the above manner, the EL layer of this embodiment can be manufactured.

This embodiment can be combined with any of the other embodiments as appropriate.

Embodiment 5

In this embodiment, examples of various electronic devices, which include the light-emitting display device of one embodiment of the present invention, will be described with reference to FIGS. 8A to 8D and FIGS. 9A to 9C.

In the light-emitting display device of one embodiment of the present invention, deterioration of an organic EL element or a transistor due to impurities such as moisture and oxygen is suppressed. Thus, highly reliable electronic device can be obtained by application of the light-emitting display device of one embodiment of the present invention.

Examples of the electronic device to which the light-emitting display device is applied include television devices (also referred to as TV or television receivers), monitors for computers and the like, cameras such as digital cameras and digital video cameras, digital photo frames, mobile phones (also referred to as cell phones or mobile phone devices), portable game machines, portable information terminals, audio playback devices, large game machines such as pachinko machines, and the like. Specific examples of these electronic devices and lighting devices are illustrated in FIGS. 8A to 8D.

Figure 8A:
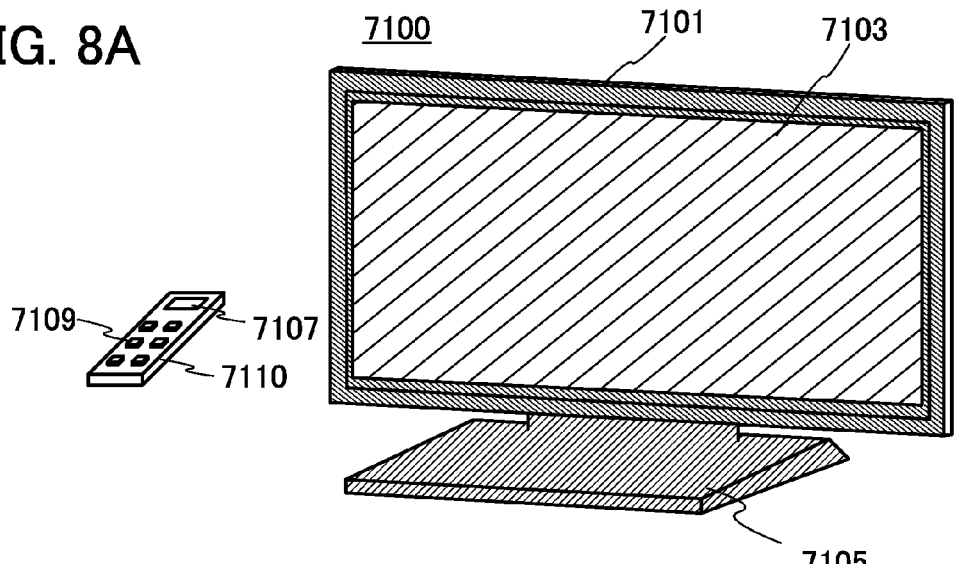
FIGS. 8A to 8D each illustrate an electronic device.

FIG. 8A illustrates an example of a television device. In a television device 7100, a display portion 7103 is incorporated in a housing 7101. Images can be displayed on the display portion 7103, and the light-emitting display device of one embodiment of the present invention can be used for the display portion 7103. A highly reliable television device can be obtained by using the light-emitting display device of one embodiment of the present invention for the display portion 7103. Since the frame of the light-emitting display device according to one embodiment of the present invention is narrow, a display region in the display portion 7103 can be large. Here, the housing 7101 is supported by a stand 7105.

Operation of the television device 7100 can be performed with an operation switch of the housing 7101 or a separate remote controller 7110. With operation keys 7109 of the remote controller 7110, channels and volume can be controlled and images displayed on the display portion 7103 can be controlled. The remote controller 7110 may be provided with a display portion 7107 for displaying data output from the remote controller 7110.

Note that the television device 7100 is provided with a receiver, a modem, and the like. With the use of the receiver, general television broadcasting can be received. Moreover, when the television device is connected to a communication network with or without wires via the modem, one-way (from a sender to a receiver) or two-way (between a sender and a receiver or between receivers) information communication can be performed.

Figure 8B:
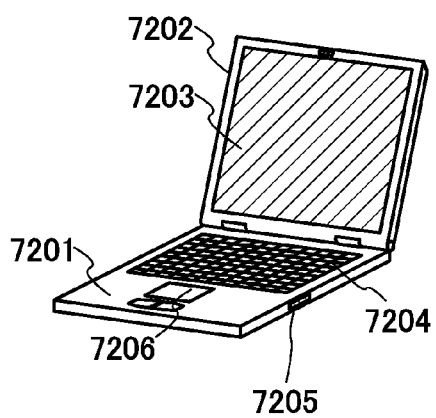

FIG. 8B illustrates a computer, which includes a main body 7201, a housing 7202, a display portion 7203, a keyboard 7204, an external connection port 7205, a pointing device 7206, and the like. Note that this computer is manufactured by using the light-emitting display device of one embodiment of the present invention for the display portion 7203. A highly reliable computer can be obtained by using the light-emitting display device of one embodiment of the present invention for the display portion 7203. Since the frame of the light-emitting display device according to one embodiment of the present invention is narrow, a display region in the display portion 7203 can be large.

Figure 8C:
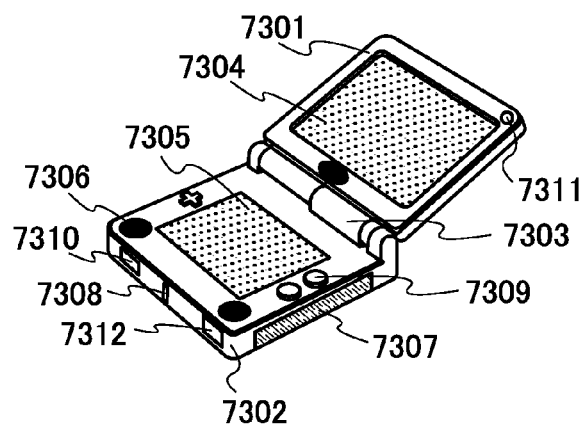

FIG. 8C illustrates a portable game machine having two housings, a housing 7301 and a housing 7302, which are connected with a joint portion 7303 so that the portable game machine can be opened or folded. A display portion 7304 is incorporated in the housing 7301 and a display portion 7305 is incorporated in the housing 7302. In addition, the portable game machine illustrated in FIG. 8C includes a speaker portion 7306, a recording medium insertion portion 7307, an LED lamp 7308, input means (an operation key 7309, a connection terminal 7310, a sensor 7311 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), and a microphone 7312), and the like. Needless to say, the structure of the portable game machine is not limited to the above as long as the light-emitting display device of one embodiment of the present invention is used for at least either the display portion 7304 or the display portion 7305, or both, and the structure can include other accessories as appropriate. A highly reliable portable game machine can be obtained by using the light-emitting display device of one embodiment of the present invention for the display portion 7304 and/or the display portion 7305. Since the frame of the light-emitting display device according to one embodiment of the present invention is narrow, a display region in the display portion 7304 and/or the display portion 7305 can be large. The portable game machine illustrated in FIG. 8C has a function of reading out a program or data stored in a storage medium to display it on the display portion, and a function of sharing information with another portable game machine by wireless communication. Note that functions of the portable game machine illustrated in FIG. 8C are not limited to them, and the portable game machine can have various functions.

Figure 8D:
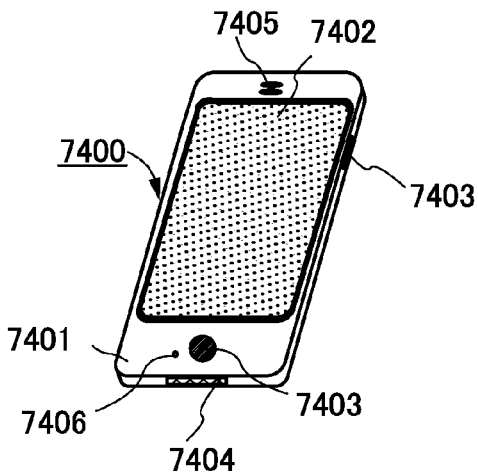

FIG. 8D illustrates an example of a mobile phone. A mobile phone 7400 is provided with a display portion 7402 incorporated in a housing 7401, operation buttons 7403, an external connection port 7404, a speaker 7405, a microphone 7406, and the like. Note that the mobile phone 7400 is manufactured by using the light-emitting display device of one embodiment of the present invention for the display portion 7402. A highly reliable mobile phone can be obtained by using the light-emitting display device of one embodiment of the present invention for the display portion 7402. Since the frame of the light-emitting display device according to one embodiment of the present invention is narrow, a display region in the display portion 7402 can be large.

When the display portion 7402 of the mobile phone 7400 illustrated in FIG. 8D is touched with a finger or the like, data can be input into the mobile phone 7400. Further, operations such as making a call and creating an e-mail can be performed by touching the display portion 7402 with a finger or the like.

There are mainly three screen modes of the display portion 7402. The first mode is a display mode mainly for displaying an image. The second mode is an input mode mainly for inputting information such as characters. The third mode is a display-and-input mode in which two modes of the display mode and the input mode are combined.

For example, in the case of making a call or creating an e-mail, a character input mode mainly for inputting characters is selected for the display portion 7402 so that characters displayed on a screen can be input. In this case, it is preferable to display a keyboard or number buttons on almost the entire screen of the display portion 7402.

When a detection device including a sensor for detecting inclination, such as a gyroscope or an acceleration sensor, is provided inside the mobile phone 7400, display on the screen of the display portion 7402 can be automatically changed by determining the orientation of the mobile phone 7400 (whether the mobile phone is placed horizontally or vertically for a landscape mode or a portrait mode).

The screen modes are switched by touch on the display portion 7402 or operation with the operation buttons 7403 of the housing 7401. The screen modes can be switched depending on the kinds of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed for a certain period while a signal detected by an optical sensor in the display portion 7402 is detected, the screen mode may be controlled so as to be switched from the input mode to the display mode.

The display portion 7402 may function as an image sensor. For example, an image of a palm print, a fingerprint, or the like is taken by the display portion 7402 while in touch with the palm or the finger, whereby personal authentication can be performed. Further, by providing a backlight or a sensing light source which emits a near-infrared light in the display portion, an image of a finger vein, a palm vein, or the like can be taken.

Figure 9A:
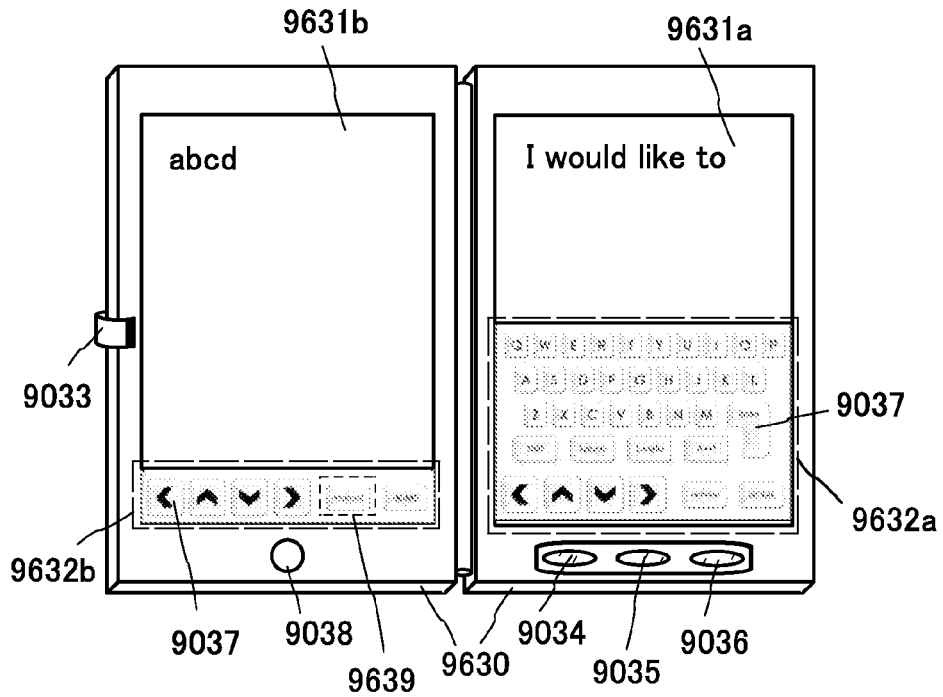
FIGS. 9A to 9C illustrate an electronic device.
Figure 9B:
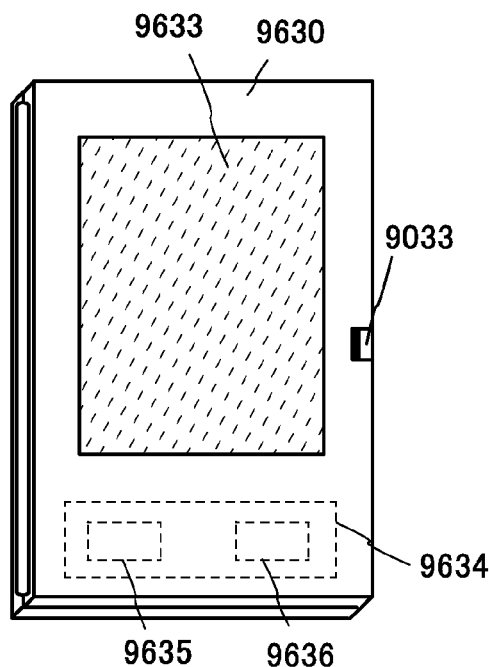

FIGS. 9A and 9B illustrate an example of a foldable tablet terminal. FIG. 9A illustrates the tablet terminal which is unfolded. The tablet terminal includes a housing 9630, a display portion 9631a, a display portion 9631b, a display mode switch 9034, a power switch 9035, a power-saving mode switch 9036, a clasp 9033, and an operation switch 9038.

The light-emitting display device of one embodiment of the present invention can be applied to the display portion 9631a or the display portion 9631b.

Part of the display portion 9631a can be a touchscreen region 9632a and data can be input when a displayed operation key 9037 is touched. Although half of the display portion 9631a has only a display function and the other half has a touchscreen function, one embodiment of the present invention is not limited to the structure. The whole display portion 9631a may have a touchscreen function. For example, a keyboard can be displayed on the entire region of the display portion 9631a so that the display portion 9631a is used as a touchscreen, and the display portion 9631b can be used as a display screen.

Like the display portion 9631a, part of the display portion 9631b can be a touchscreen region 9632b. When a switching button 9639 for showing/hiding a keyboard on the touchscreen is touched with a finger, a stylus, or the like, the keyboard can be displayed on the display portion 9631b.

Touch input can be performed in the touchscreen region 9632a and the touchscreen region 9632b at the same time.

The display mode switch 9034 can switch the display between portrait mode, landscape mode, and the like, and between monochrome display and color display, for example. With the power-saving mode switch 9036, the luminance of display can be optimized in accordance with the amount of external light at the time when the tablet terminal is in use, which is detected with an optical sensor incorporated in the tablet terminal. The tablet terminal may include another detection device such as a sensor for detecting orientation (e.g., a gyroscope or an acceleration sensor) in addition to the optical sensor.

Although FIG. 9A illustrates an example in which the display portion 9631a and the display portion 9631b have the same display area, one embodiment of the present invention is not limited to the example. The display portion 9631a and the display portion 9631b may have different display areas and different display quality. For example, higher definition images may be displayed on one of the display portions 9631a and 9631b.

FIG. 9B illustrates the tablet terminal which is folded. The tablet terminal includes the housing 9630, a solar cell 9633, a charge and discharge control circuit 9634, a battery 9635, and a DC-to-DC converter 9636. Note that FIG. 9B illustrates an example in which the charge and discharge control circuit 9634 includes the battery 9635 and the DC-to-DC converter 9636.

Since the tablet terminal is foldable, the housing 9630 can be closed when the tablet terminal is not in use. As a result, the display portion 9631a and the display portion 9631b can be protected, thereby providing a tablet terminal with high endurance and high reliability for long-term use.

The tablet terminal illustrated in FIGS. 9A and 9B can have other functions such as a function of displaying various kinds of data (e.g., a still image, a moving image, and a text image), a function of displaying a calendar, a date, the time, or the like on the display portion, a touch-input function of operating or editing the data displayed on the display portion by touch input, and a function of controlling processing by various kinds of software (programs).

The solar cell 9633 provided on a surface of the tablet terminal can supply power to the touchscreen, the display portion, a video signal processing portion, or the like. Note that the solar cell 9633 is preferably provided on one or two surfaces of the housing 9630, in which case the battery 9635 can be charged efficiently. When a lithium ion battery is used as the battery 9635, there is an advantage of downsizing or the like.

Figure 9C:
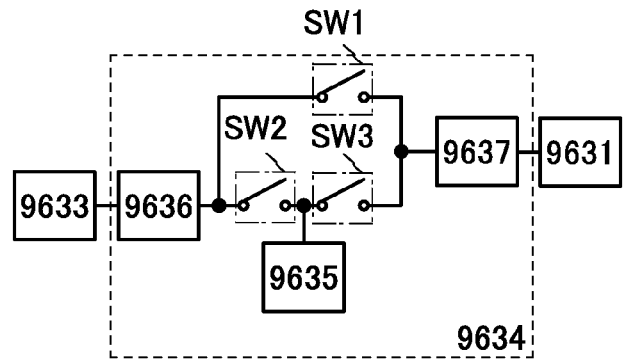

The structure and operation of the charge and discharge control circuit 9634 illustrated in FIG. 9B will be described with reference to a block diagram of FIG. 9C. FIG. 9C illustrates the solar cell 9633, the battery 9635, the DC-to-DC converter 9636, a converter 9637, switches SW1 to SW3, and a display portion 9631. The battery 9635, the DC-to-DC converter 9636, the converter 9637, and the switches SW1 to SW3 correspond to the charge and discharge control circuit 9634 illustrated in FIG. 9B.

First, description is made on an example of the operation in the case where power is generated by the solar cell 9633 with the use of external light. The voltage of the power generated by the solar cell is raised or lowered by the DC-to-DC converter 9636 so as to be voltage for charging the battery 9635. Then, when power from the solar cell 9633 is used for the operation of the display portion 9631, the switch SW1 is turned on and the voltage of the power is raised or lowered by the converter 9637 so as to be voltage needed for the display portion 9631. When images are not displayed on the display portion 9631, the switch SW1 is turned off and the switch SW2 is turned on so that the battery 9635 is charged.

Although the solar cell 9633 is described as an example of a power generation means, the power generation means is not particularly limited, and the battery 9635 may be charged by another power generation means such as a piezoelectric element or a thermoelectric conversion element (Peltier element). For example, the battery 9635 may be charged by a non-contact power transmission module capable of performing charging by transmitting and receiving power wirelessly (without contact), or any of the other charge means used in combination.

In the above-described manner, electronic devices and lighting devices can be obtained by application of the light-emitting display device of one embodiment of the present invention. The applicable range of the light-emitting display device of one embodiment of the present invention is so wide that the light-emitting display device can be applied to electronic devices in a variety of fields.

Note that the structure described in this embodiment can be combined with any of the structures described in the above embodiments as appropriate.

This application is based on Japanese Patent Application serial no. 2012-188066 filed with Japan Patent Office on Aug. 28, 2012, the entire contents of which are hereby incorporated by reference.

What is claimed is:

1. A display device comprising:
   a first substrate and a second substrate facing each other;
   a pixel portion including a display element, the pixel portion being between the first substrate and the second substrate;
   a first sealant provided around a periphery of the pixel portion; and
   a second sealant seamlessly provided around a periphery of the first sealant and in contact with at least one of a side surface of the first substrate and a side surface of the second substrate, the second sealant filling a gap between the first substrate and the second substrate,
   wherein the second sealant is a metal layer.

2. The display device according to claim 1,
   wherein the second sealant has lower moisture permeability than the first sealant.

3. The display device according to claim 1,
   wherein the first sealant is a resin layer or a glass layer.

4. The display device according to claim 1,
   wherein the display element is an organic EL element.

5. The display device according to claim 1,
   wherein the pixel portion comprises a transistor, and
   wherein a channel formation region of the transistor includes an oxide semiconductor layer.

6. The display device according to claim 1,
   wherein a total width of the first sealant and the second sealant is 1 mm or less.

7. The display device according to claim 1,
   wherein the first substrate has a larger area than the second substrate.

8. A display device comprising:
   a first substrate and a second substrate facing each other;
   a pixel portion including a display element, the pixel portion being between the first substrate and the second substrate;
   a first sealant provided around a periphery of the pixel portion;
   a second sealant seamlessly provided around a periphery of the first sealant and in contact with at least one of a side surface of the first substrate and a side surface of the second substrate, the second sealant filling a gap between the first substrate and the second substrate; and
   a third sealant overlapping with a side surface of the first sealant and at least one of the side surface of the first substrate and the side surface of the second substrate with the second sealant interposed therebetween.

9. The display device according to claim 8,
   wherein the third sealant has lower moisture permeability than the first sealant and the second sealant.

10. The display device according to claim 8,
    wherein the third sealant is a metal layer or a thermoplastic resin.

11. The display device according to claim 8,
    wherein the display element is an organic EL element.

12. The display device according to claim 8,
    wherein the pixel portion comprises a transistor, and
    wherein a channel formation region of the transistor includes an oxide semiconductor layer.

13. The display device according to claim 8,
    wherein a total width of the first sealant and the second sealant is 1 mm or less.

14. The display device according to claim 8,
    wherein the first substrate has a larger area than the second substrate.

15. A display device comprising:
    a pixel portion including a display element;
    a first substrate and a second substrate facing each other with the pixel portion therebetween;
    a first sealant provided around a periphery of the pixel portion;
    a second sealant seamlessly provided around a periphery of the first sealant and in contact with at least one of a side surface of the first substrate and a side surface of the second substrate, the second sealant filling a gap between the first substrate and the second substrate; and
    a third sealant provided around a periphery of the second sealant,
    wherein the first sealant is a photocurable resin,
    wherein the second sealant is a glass layer, and
    wherein the third sealant is a metal layer.

16. The display device according to claim 15,
    wherein the third sealant has lower moisture permeability than the first sealant and the second sealant.

17. The display device according to claim 15,
    wherein the display element is an organic EL element.

18. The display device according to claim 15,
    wherein the pixel portion comprises a transistor, and
    wherein a channel formation region of the transistor includes an oxide semiconductor layer.

19. The display device according to claim 15,
    wherein a total width of the first sealant and the second sealant is 1 mm or less.

20. The display device according to claim 15,
    wherein the first substrate has a larger area than the second substrate.

* * * * *